(12) United States Patent
Rogers

(10) Patent No.: US 10,580,681 B2
(45) Date of Patent: Mar. 3, 2020

(54) ROBOTIC APPARATUS AND METHOD FOR TRANSPORT OF A WORKPIECE

(71) Applicant: YASKAWA AMERICA, INC., Waukegan, IL (US)

(72) Inventor: John Charles Rogers, Danville, CA (US)

(73) Assignee: YASKAWA AMERICA INC., Waukegan, IL (US)

(*) Notice: Subject to any disclaimer, the term of this patent is extended or adjusted under 35 U.S.C. 154(b) by 266 days.

(21) Appl. No.: 15/644,828

(22) Filed: Jul. 10, 2017

(65) Prior Publication Data
US 2018/0012789 A1  Jan. 11, 2018

Related U.S. Application Data

(60) Provisional application No. 62/360,458, filed on Jul. 10, 2016.

(51) Int. Cl.
| | |
|---|---|
| H01L 21/67 | (2006.01) |
| H01L 21/687 | (2006.01) |
| B25J 15/06 | (2006.01) |
| B25J 13/08 | (2006.01) |
| B25J 9/04 | (2006.01) |
| B25J 11/00 | (2006.01) |
| B25J 19/02 | (2006.01) |
| H01L 21/677 | (2006.01) |
| B25J 9/16 | (2006.01) |

(52) U.S. Cl.
CPC ........ *H01L 21/68707* (2013.01); *B25J 9/042* (2013.01); *B25J 11/0095* (2013.01); *B25J 13/088* (2013.01); *B25J 15/0616* (2013.01); *B25J 19/023* (2013.01); *H01L 21/67742* (2013.01); *H01L 21/67766* (2013.01); *B25J 9/1651* (2013.01)

(58) Field of Classification Search
USPC ................................................ 700/245–264
See application file for complete search history.

(56) References Cited

U.S. PATENT DOCUMENTS

| | | | | |
|---|---|---|---|---|
| 4,884,941 A | * | 12/1989 | Kazerooni | B24B 9/00 414/744.5 |
| 4,907,467 A | | 3/1990 | Toyoda et al. | |
| 5,418,441 A | * | 5/1995 | Furukawa | B25J 9/1641 318/568.22 |

(Continued)

FOREIGN PATENT DOCUMENTS

EP    1975997    10/2008

*Primary Examiner* — Jonathan L Sample
(74) *Attorney, Agent, or Firm* — Mori & Ward, LLP

(57) ABSTRACT

A robotic apparatus for transporting a workpiece includes a first arm that pivots about a first axis and a second arm that is pivotably connected to the first arm. The second arm has a surface upon which the workpiece can be received. A first drive unit of the robotic apparatus drives the first arm member to pivot about the first axis. The robotic apparatus includes a controller that controls the first drive unit to move the surface of the second arm member to transport the workpiece. The control unit also controls the first drive unit such that the surface is not moved at an acceleration value that exceeds a predetermined acceleration limit during the transport of the workpiece.

19 Claims, 13 Drawing Sheets

(56) References Cited

U.S. PATENT DOCUMENTS

| | | | |
|---|---|---|---|
| 5,655,060 A * | 8/1997 | Lucas | B25J 9/1664 700/250 |
| 5,682,795 A * | 11/1997 | Solomon | B25J 9/1045 403/387 |
| 6,085,125 A * | 7/2000 | Genov | H01L 21/681 414/226.05 |
| 6,216,058 B1 * | 4/2001 | Hosek | B25J 9/1664 700/245 |
| 6,225,012 B1 * | 5/2001 | Nishi | G03F 7/70691 430/22 |
| 6,464,448 B1 * | 10/2002 | Ha | B25J 9/104 414/744.5 |
| 6,489,741 B1 * | 12/2002 | Genov | B25J 9/1615 318/561 |
| 6,571,657 B1 * | 6/2003 | Olgado | B25J 9/1638 257/E21.175 |
| 6,643,563 B2 * | 11/2003 | Hosek | B25J 9/1664 414/754 |
| 7,048,316 B1 * | 5/2006 | Blank | H01L 21/67748 294/213 |
| 7,129,694 B2 * | 10/2006 | Brunner | H01L 21/67288 324/750.14 |
| 7,130,716 B2 | 10/2006 | Rogers et al. | |
| 7,456,977 B2 * | 11/2008 | Ramsey | H01L 21/67259 348/94 |
| 7,531,979 B2 | 5/2009 | Ou et al. | |
| 7,636,612 B2 * | 12/2009 | Weber | B21D 43/05 700/159 |
| 7,904,182 B2 * | 3/2011 | Hosek | G05B 19/4148 118/687 |
| 8,136,422 B2 | 3/2012 | Kitahara et al. | |
| 8,371,795 B2 | 2/2013 | Kitahara et al. | |
| 8,433,436 B2 * | 4/2013 | Doki | H01L 21/68 700/214 |
| 8,716,909 B2 * | 5/2014 | Hosek | H02K 5/128 310/64 |
| 8,863,930 B2 | 10/2014 | Kitahara et al. | |
| 8,950,998 B2 * | 2/2015 | Meulen | B65G 25/02 414/217 |
| 9,024,488 B2 * | 5/2015 | Gilchrist | H02K 7/09 310/114 |
| 9,026,244 B1 * | 5/2015 | Mazzocco | G05B 19/401 700/229 |
| 9,108,322 B2 * | 8/2015 | Chisholm | B25J 13/085 |
| 10,052,756 B2 | 8/2018 | Kuribayashi et al. | |
| 2002/0167801 A1 * | 11/2002 | Suhara | H05K 13/0413 361/728 |
| 2002/0191878 A1 * | 12/2002 | Ueda | C23C 8/02 384/492 |
| 2003/0223057 A1 * | 12/2003 | Ramsey | H01L 21/67259 356/147 |
| 2004/0249509 A1 * | 12/2004 | Rogers | B25J 9/1664 700/245 |
| 2005/0115352 A1 * | 6/2005 | Tanaka | B25J 9/042 74/490.03 |
| 2005/0224902 A1 * | 10/2005 | Ramsey | H01L 21/67253 257/433 |
| 2005/0233770 A1 * | 10/2005 | Ramsey | H01L 21/67253 455/561 |
| 2006/0130750 A1 * | 6/2006 | Ishikawa | G03B 27/32 118/300 |
| 2007/0264106 A1 * | 11/2007 | van der Meulen | B25J 9/0084 414/217 |
| 2009/0038258 A1 * | 2/2009 | Pivac | B25J 5/00 52/749.14 |
| 2009/0232630 A1 * | 9/2009 | Roberts | H01L 21/67259 414/744.2 |
| 2009/0243413 A1 * | 10/2009 | Gilchrist | H02K 7/09 310/90.5 |
| 2010/0081095 A1 * | 4/2010 | Shibazaki | G03F 7/70775 430/325 |
| 2010/0157275 A1 * | 6/2010 | Shibazaki | G03F 7/70341 355/72 |
| 2012/0249992 A1 * | 10/2012 | Matsuura | H01L 21/68707 355/72 |
| 2012/0257176 A1 * | 10/2012 | Hayashi | H01L 21/67259 355/27 |
| 2013/0041509 A1 * | 2/2013 | Saito | B25J 9/06 700/261 |
| 2013/0071218 A1 * | 3/2013 | Hosek | H01L 21/67259 414/744.5 |
| 2013/0336753 A1 * | 12/2013 | Shimamoto | H01L 21/67742 414/744.5 |
| 2014/0201571 A1 * | 7/2014 | Hosek | G05B 23/0283 714/26 |
| 2014/0301818 A1 * | 10/2014 | Gilchrist | H01L 21/67742 414/744.2 |
| 2014/0348618 A1 * | 11/2014 | Blank | H01L 21/67742 414/217 |
| 2015/0174768 A1 * | 6/2015 | Rodnick | H01L 21/677 414/744.2 |
| 2015/0179491 A1 * | 6/2015 | Katsuda | B25J 9/1694 700/213 |
| 2015/0214086 A1 * | 7/2015 | Hofmeister | H01L 21/67709 414/744.5 |
| 2016/0136812 A1 * | 5/2016 | Hosek | B25J 9/1638 700/254 |
| 2018/0141208 A1 | 5/2018 | Shiraki et al. | |

* cited by examiner

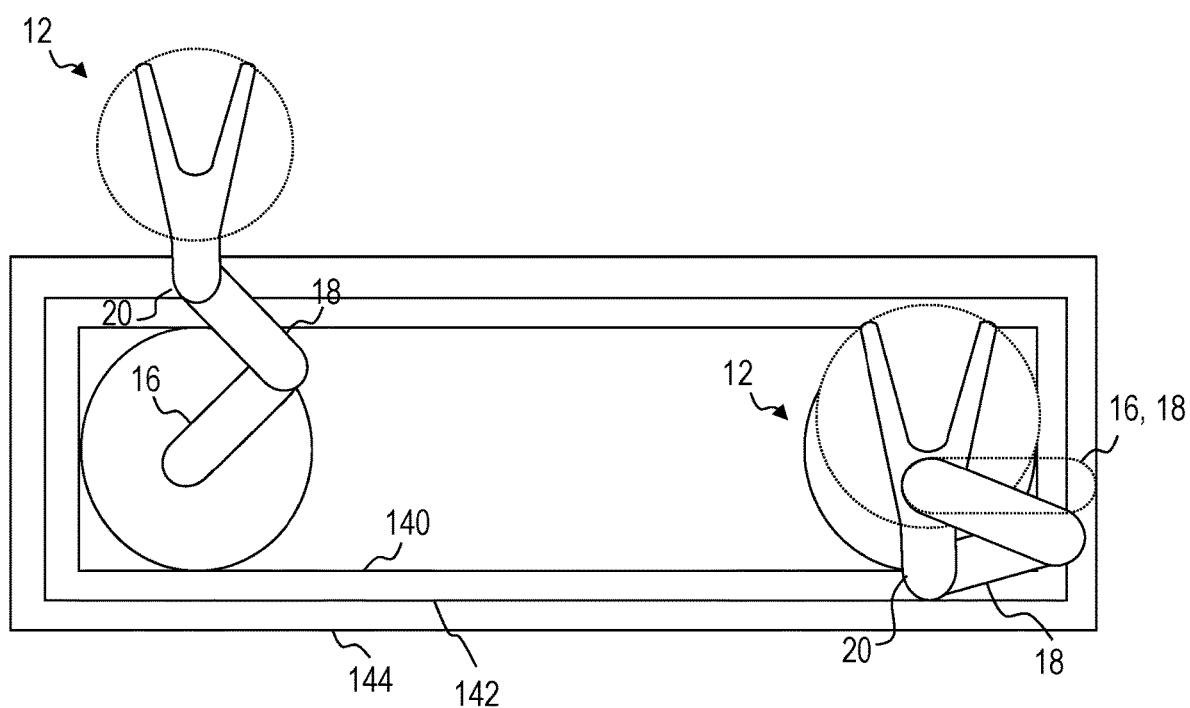

ROBOTIC APPARATUS AND METHOD FOR TRANSPORT OF A WORKPIECE

CROSS-REFERENCE TO RELATED APPLICATION

The present application claims priority under 35 U.S.C. § 119(e) to U.S. provisional Application No. 62/360,458, filed on Jul. 10, 2017, the entire contents of which are herein incorporated by reference.

BACKGROUND OF THE INVENTION

Field of the Invention

The present invention relates to a robotic apparatus, robotic handling system, and method for transporting a workpiece between various positions.

Discussion of the Background

Automated transfer devices significantly improve the efficiency, speed, and reliability at which workpieces such as semiconductor wafers are processed. Automation is particularly useful in clean room environments. When robots are used for wafer transferring should quickly and precisely transfer a wafer between various locations to reduce manufacturing time and ensure sufficient yield. During the operation of such robots, disturbances such as velocity ripple frequently occur. These disturbances cause uneven acceleration, create abrasions on the workpiece, and even move the workpiece out of proper alignment.

The above-described disturbances can reduce the yield of a manufacturing operation, increasing cost and reducing output over time.

SUMMARY OF THE INVENTION

The present invention advantageously provides a robotic apparatus for transporting a workpiece. The robotic apparatus comprises a first arm member configured to pivot about a first axis and a second arm member. The second arm member is pivotably connected to the first arm member and has a surface upon which a workpiece can be received. The robotic apparatus includes a first drive unit configured to drive the first arm member to pivot about the first axis. The robotic apparatus also includes a control unit that is configured to control the first drive unit to move the surface of the second arm member to transport the workpiece. The control unit is also configured to control the first drive unit such that the surface is not moved at an acceleration value that exceeds a predetermined acceleration limit during the transport of the workpiece.

The present invention advantageously provides a robotic apparatus for transporting a semiconductor wafer. The robotic apparatus comprises a first arm member configured to pivot about a first axis and a second arm member. The second arm member is pivotably connected to the first arm member and has a surface upon which a semiconductor wafer can be received. The robotic apparatus includes a first drive unit configured to drive the first arm member to pivot about the first axis, the first drive unit including a direct drive motor having a rotor coaxially disposed about the first axis. The robotic apparatus also includes a control unit that is configured to control the first drive unit to move the surface of the second arm member to transport the semiconductor wafer.

The present invention advantageously provides a method of transporting a workpiece with a robotic apparatus. The method includes providing a robotic apparatus that has a first arm member configured to pivot about a first axis and a second arm member. The second arm member is pivotably connected to the first arm member and has a surface upon which a workpiece can be received. The robotic apparatus includes a first drive unit configured to drive the first arm member to pivot about the first axis. The robotic apparatus also includes a control unit that is configured to control the first drive unit to move the surface of the second arm member to transport the workpiece. The control unit is also configured to control the first drive unit to move the surface of the second arm member to transport the workpiece. The method includes determining a motion profile to transport the workpiece applied when transporting the workpiece. The method also includes controlling the first drive unit to transport the workpiece according to the motion profile without moving the surface at an acceleration value that exceeds a predetermined acceleration limit.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which:

FIG. 5 is a diagram of an exemplary workspace for a robot according to an embodiment of the present invention;

DETAILED DESCRIPTION OF EXEMPLARY EMBODIMENTS OF THE INVENTION

Figure 1:
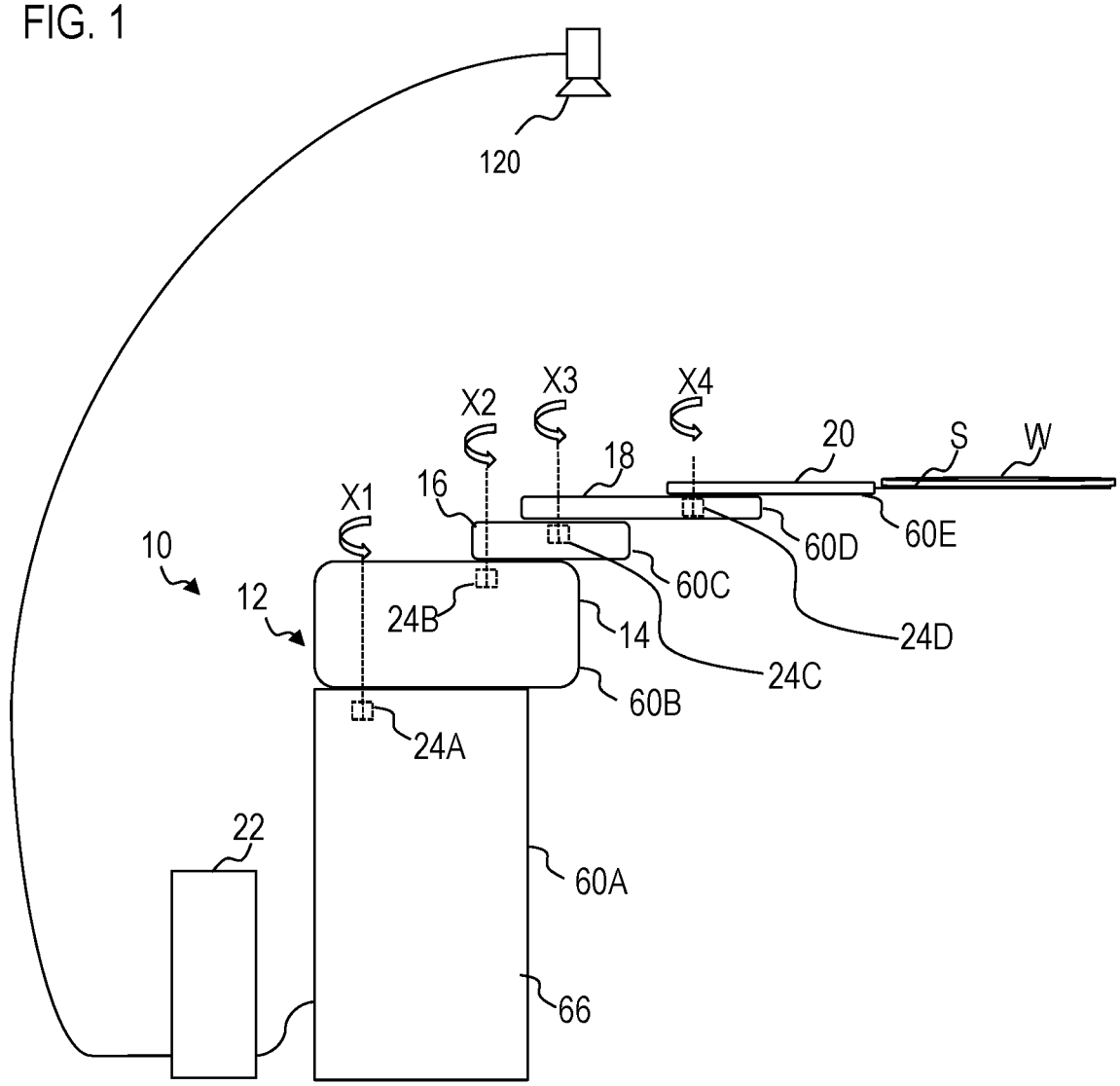
FIG. 1 is a diagram illustrating a robot and a control unit according to an embodiment of the present invention.

Embodiments of the present invention will be described hereinafter with reference to the accompanying drawings. In the following description, the constituent elements having substantially the same function and arrangement are denoted by the same reference numerals, and repetitive descriptions will be made only when necessary.

A configuration of a robotic apparatus 10 will be described according to an exemplary embodiment of the invention. FIG. 1 is an exemplary robotic apparatus 10 that includes a transfer robot (or robot) 12 and a robot controller (or control unit) 22. The robot 12 includes a plurality of arm members that are rotatable with respect to each other. Torso 14 (fourth arm member), first arm 16 (third arm member), second arm 18 (first arm member), and third arm 20 (second arm member) are exemplary arm members, each of which is rotated by a respective drive unit 24A-24D (collectively referenced as drive units) provided therein or in association therewith. As illustrated in FIG. 1, the torso 14 is rotatable about pivot axis X1, the first arm 16 is rotatable about pivot axis X2, the second arm 18 is rotatable about pivot axis X3, and the third arm is rotatable about pivot axis X4, such that each arm unit rotates about a respective pivot axis (collectively referenced as pivot axes). The third arm 20 is connected to a distal end of the second arm 18 and includes a surface S that supports a substrate W, such as a semiconductor wafer. Substrate W is an example of a workpiece. Workpieces other than semiconductor wafers can be transported in the manner discussed below with reference to substrate W. The second arm 18 is connected to a distal end of first arm 16. The first arm 16 is connected to a distal end of torso 14, which is in turn connected to base 66. Therefore, base 66 supports torso 14, first arm 16, second arm 18, and third arm 20. The base 66 includes a housing 60A, the torso 14 includes a housing 60B, the first arm 16 includes a housing 60C, the second arm 18 includes a housing 60D, and the third arm, 20 includes a housing 60E (collectively referenced as housing). Robot 12 can be formed as a Selective Compliance Assembly robot (SCARA robot), for example. As described in greater detail below, robot 12 can be formed as a dual arm robot where, for example, each arm includes first, second, third, and fourth arm members, and a surface S.

Control unit 22 outputs commands to bring each of the torso 14, first arm 16, second arm 18, and third arm 20 into motion, as will be described in further detail below. Control unit 22 can be included outside the housing of robot 12 as depicted in FIG. 1, or inside the housing of robot 12. Control unit 22 communicates with robot 12 and the drive units directly, or in conjunction with an intermediate control device, which can include an amplifier. When an amplifier is included as an intermediate device, control unit 22 is configured to issue commands to the amplifier, which in turns generates control signals for one or more of the drive units. Control unit 22 can also receive instructions from a higher-level device such as a programmable logic controller, for example.

As illustrated in FIG. 1, the torso 14 is rotatable about pivot axis X1, the first arm 16 is rotatable about pivot axis X2, the second arm 18 is rotatable about pivot axis X3, and the third arm 20 is rotatable about pivot axis X4. This rotational motion is accomplished by a corresponding drive unit constituted by a motor drive or servo motor, for example. Control unit 22 is configured to control the drive units for each of the torso 14, first arm 16, second arm 18, and third arm 20. Each drive unit provides feedback that indicates at least a position of the drive unit to control unit 22. The position feedback is provided directly from the respective drive units, which perform torque-sensing, from an external sensor 120, or any combination of torque-sensing drive units and external sensors. External sensor 120 can include some components. Control unit 22 controls the operation of drive units in accordance with the feedback information to control the position of each of the torso 14, the first arm 16, the second arm 18, and the third arm 20.

When the drive units are direct drive units, as described in more detail below with respect to the depiction in FIG. 6b, the drive units can be disposed within respective housings 60A-60D. For example, the drive unit 24A for the torso 14 can be provided in a housing 60A of base 66. Thus, separate drive unit housings for housing the motor and gears are not necessary when direct drive units are used for drive units.

Figure 2:
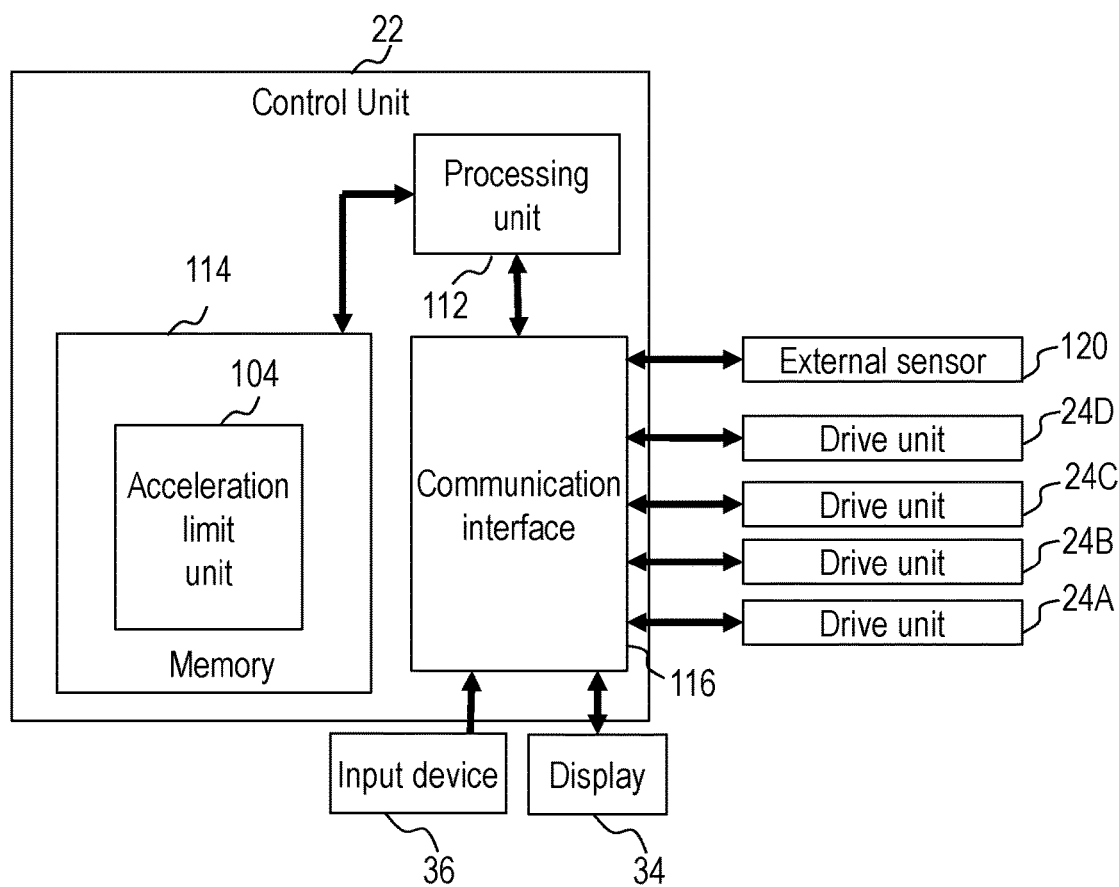
FIG. 2 is a block diagram illustrating a control unit and drive units according to an embodiment of the present invention.

FIG. 2 illustrates an exemplary configuration of the control unit 22. As illustrated in FIG. 2, the drive units are each in communication with control unit 22. Although four drive units 24A-24D are depicted in FIG. 2, additional drive units can be provided for each respective axis, including torso 14, first arm 16, second arm 18, and third arm 20. Control unit 22 includes a processing unit 112 and a memory 114. Processing unit 112 is a processing device such as a microprocessor or CPU and communicates with memory 114 and executes instructions (e.g., software programs) provided by acceleration limit unit 104, which is stored in memory 114, which is a long-term non-volatile storage device such as a hard disk, solid state storage device, EEPROM, or other non-transitory storage medium. Acceleration limit unit 104 allows control unit 22 to command the drive units based on an allowable acceleration (acceleration limit) applied when robot 12 is brought into motion in order to transport substrate W. This allowable acceleration can be provided as an allowable acceleration value which is a predefined value determined in advance or set by a user, as described below. As the acceleration of substrate W is equivalent to the acceleration of surface S and third arm 20, the allowable acceleration is a maximum acceptable acceleration that can be applied to third arm 20, surface S, and substrate W. The allowable acceleration can be provided as a maximum acceptable value of jerk. Jerk is the time derivative of acceleration, or a rate of change of acceleration in time. The magnitude of jerk relates directly to the impulse to the substrate W. Higher impulse can lead to higher acceleration overshoot and thus higher peak acceleration. Thus, by limiting jerk, it is possible to ensure accurate tracking of a motion profile. As provided herein, the allowable acceleration and acceleration limit encompass the use of an allowable acceleration value, an allowable jerk value, or both.

Control unit 22 is in communication with a user interface that includes an input device 34 and a display 36 that can include a visual display and audio input/output capabilities.

Control unit 22 includes a wired and/or wireless communication interface 116 to communicate with input device 34 and display 36, and can also include a volatile memory. Communication interface 116 accepts input from input device 36, which can include a mouse and/or keyboard, and controls display 34 to display information to a user. Communication interface 116 can also receive feedback from each of the drive units and output commands to the respective drive units. If an external sensor 120 is used to provide position feedback, this feedback information is also received by communication interface 116. The issuance of commands to the drive units and the receipt of feedback can be accomplished by direct communication or through an intermediate device such as an amplifier.

A user can interact with input device 36 to configure the allowable acceleration set by acceleration limit unit 104. Thus, a user can observe the allowable acceleration with display 34 and set and/or modify the allowable acceleration with input device 36. Input device 36 and display 34 can be components of control unit 22 or provided as parts of a separate personal computer that communicates with communication interface 116.

Communication interface 116 of control unit 22 can be configured to receive data from display 34, input device 36, and the drive units. Alternatively, a separate communication interface 116 can be provided for the drive units alone. In this case, communication interface 116 for the drive units receives feedback from the drive units, via a cable, for example, and provides this feedback to processing unit 112. The communication interface 116 for the drive units outputs commands to control the drive units directly or through an intermediate device such as an amplifier.

Figure 3:
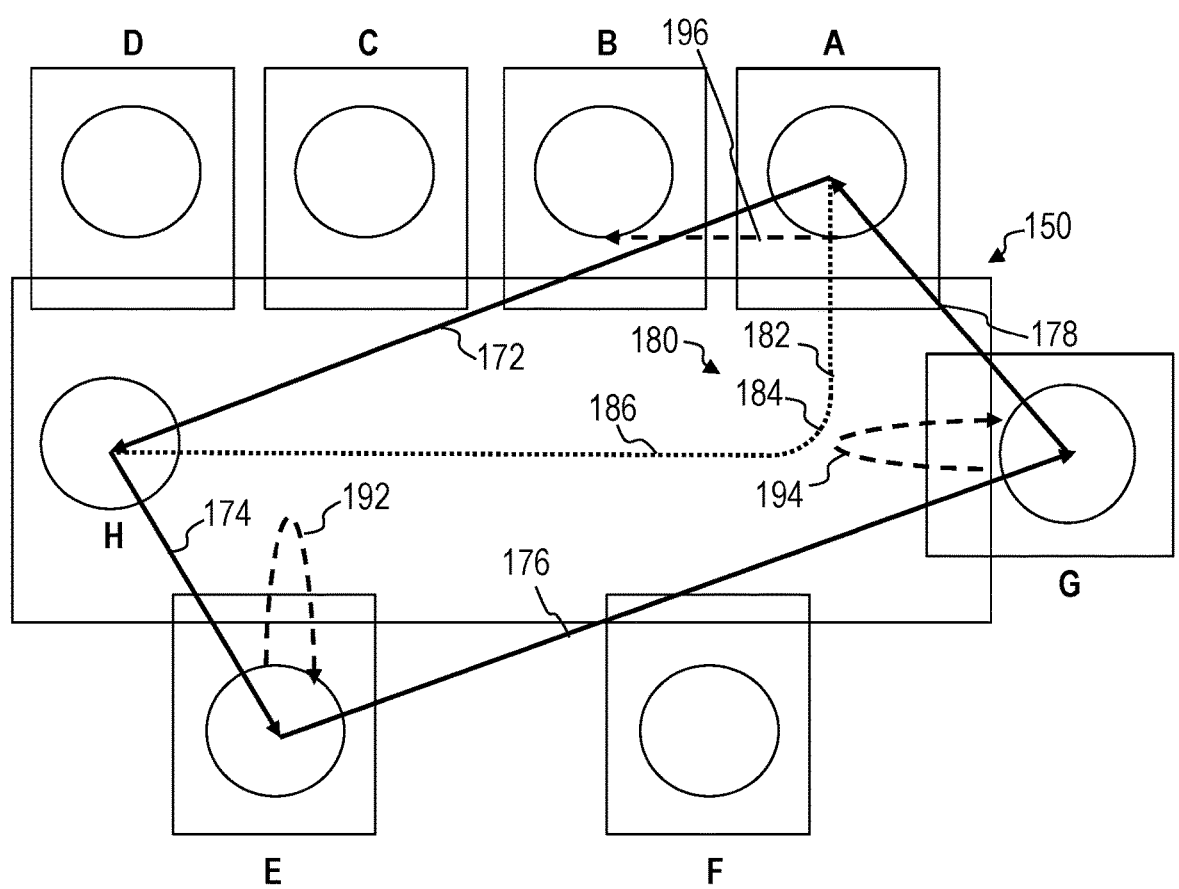
FIG. 3 is plan view of a workspace and a handling sequence according to an embodiment of the present invention.

FIG. 3 provides a plan view of an exemplary handling sequence for a substrate W within a processing system. The handling sequence of FIG. 3 can be employed to transport a substrate W formed by a semiconductor wafer. Each of the stations A-G is formed as an FOUP (Front Open Unified Pod) connected to an Equipment Front End Module (EFEM) or Front Interface (FI) 150 included within the substrate processing system. Station H is, for example, a pre-aligner station located within the EFEM. A robot located within the EFEM, can perform a handling sequence by beginning at station A (or alternatively at station B, station C, or station D), moving substrate W to pre-aligner or aligning station H, subsequently moving the substrate W to station E, moving the substrate to side storage station G, and finally returning the substrate W to station A, as illustrated in the solid lines 172, 174, 176, 178 of FIG. 3. Solid lines 172, 174, 176, 178 represent the flow of the handling sequence and not the actual path of robot 12 or substrate W. An exemplary path representing an actual motion path of substrate W between Station A and Station H is illustrated by a dotted line 180 extending therebetween. This path 180 includes both straight line segments 182, 186 and an arc-shaped or curved segment 184 having a constant radius. The path alternatively could include a parabolic curve. After the substrate W is transported to stations E and G, the robot 12 can withdraw from the corresponding station, as illustrated by the dashed lines 192 and 194 shown at these stations. At each withdrawal, the robot 12 can enter a standby position to await processing of the substrate W, as represented by dashed lines 192 and 194, or perform a transfer of another substrate W, as represented by dashed line 196 in which robot 12 moves within the FI from station A to station B without a substrate W. Thus, the robot 12 is configured to transport a substrate W between multiple origins and destinations within the FOUPs and the FI. The robot 12 is further configured to transfer substrate W by first acquiring the substrate W and placing substrate W on a surface S of third arm 20, moving substrate W to a destination station, transferring the substrate W to a predetermined position within the destination station, and subsequently withdrawing from the destination station without the substrate W.

Figure 4A:
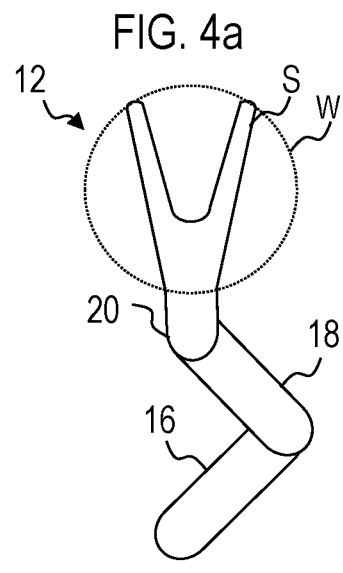
FIGS. 4a-4f are plan views of arms employed with a robot according to an embodiment of the present invention.
Figure 4B:
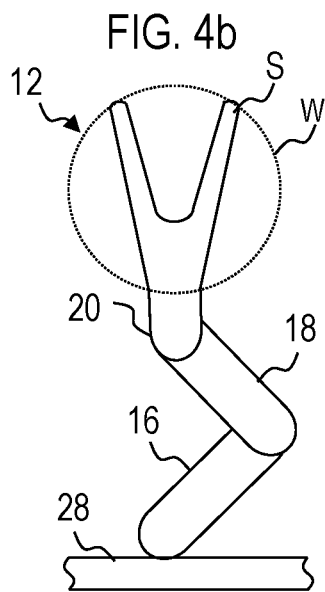
Figure 4C:
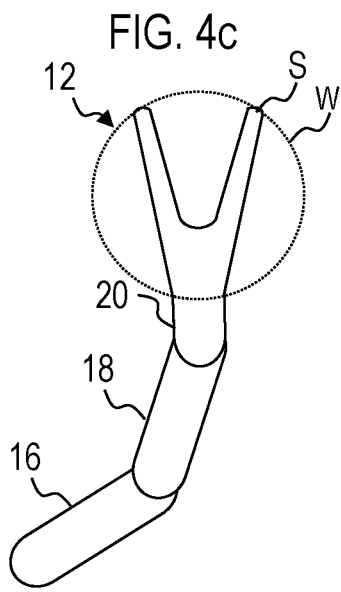
Figure 4D:
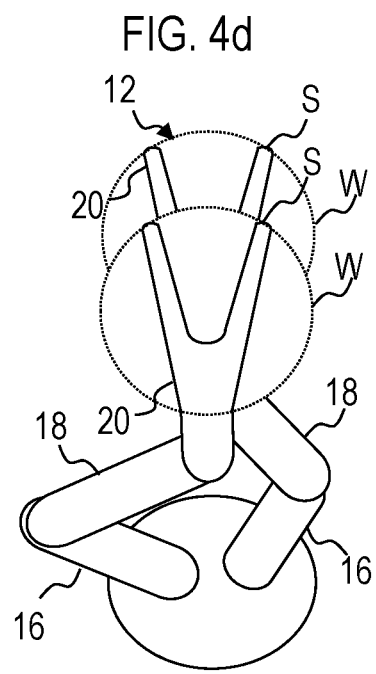
Figure 4E:
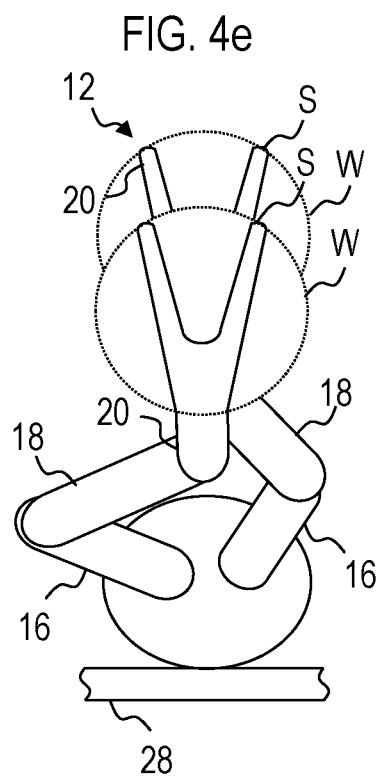
Figure 4F:
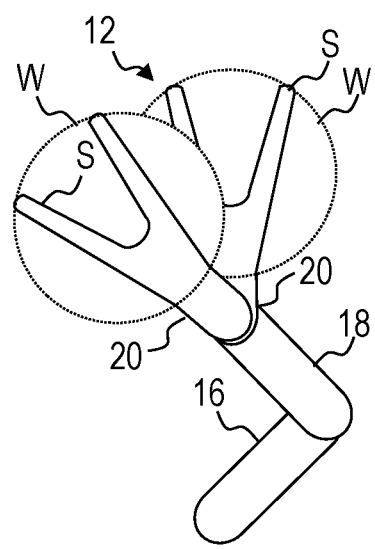

FIGS. 4a-4f depict a series of exemplary robot 12 configurations according to an embodiment of the present invention. Each of FIGS. 4a-4f depicts at least one substrate W and surface S of third arm 20. FIG. 4a illustrates a single arm unit formed by at least two arm members (individual first and second arms 16, 18) and a passive third arm 20. FIG. 4b is similar to the single arm of FIG. 4a, and also includes a track 28 that can impart translational motion to the robot 12 along the track 28. FIG. 4c illustrates a single arm unit similar to that of FIG. 4a, but includes an active third arm 20 that is driven by drive unit 24D. FIG. 4d illustrates a dual arm unit robot 12, in which each arm unit includes at least two arm members (individual first and second arms 16, 18) and a respective third arm 20. FIG. 4e provides a dual arm unit robot 12 similar to that of FIG. 4d, but including a track 28 for translational motion of the dual arm robot along the track 28. FIG. 4f provides a single arm unit robot with two third arms 20, or a dual wrist arm. Each of the third arms 20 of the robotic apparatus 12 of FIG. 4f is actively controlled by a respective drive unit. The first, second, and third arms 16, 18, 20, and tracks 28 depicted in FIGS. 4a-4f can be connected to base 60, for example. The dual arm robots in FIGS. 4d-4e each include two surfaces S, providing for simultaneous transport of two substrates W. Each surface of the dual arm robot 12 is independently controlled by control unit 22.

Third arm 20 can include one or more end effector such as edge-gripping and/or vacuum devices which can provide additional security to substrate W supported on surface S of third arm 20. Edge-gripping devices contact an outer circumferential area of substrate W, while suction or vacuum devices supply suction to an underside of substrate W. Advantageously, as illustrated in FIGS. 4a-4f, third arm 20 can be provided without an end effector, thereby eliminating the need for an edge-gripping end effector device or a vacuum end effector device. The omission of an end effector in third arm 20 is especially useful when used in combination with direct drive units having a direct drive configuration as depicted in FIG. 6b and described in further detail below. For example, third arm 20 can support substrate W entirely by friction between a surface S of third arm 20 and a surface of the underside of the substrate W. By supporting and transporting substrate W entirely by friction and eliminating end effectors such as an edge-gripping or vacuum devices, contamination and abrasion of substrate W is reduced. The resulting configuration of the third arm 20 is less complex, and the cost of the third arm 20 is reduced.

FIG. 5 illustrates a schematic view of the boundaries of an EFEM for use with an exemplary robot 12 having two arm members. Three rectangles depict spatial considerations with regards to the footprint of an EFEM or FI. The innermost rectangle 140 in FIG. 5 depicts an ideal boundary defined by the dimensions of robot 12, while the outermost 146 rectangle represents a minimum space required for articulation of the arm members of the robot 12. The intermediate rectangle 142 is defined by third arm 20. Potential positions of one of the arm members 16, 18 is illustrated in phantom on the right portion of FIG. 5. This position illustrates the minimum space required in the EFEM for articulation of robot 12. As EFEM space is a valuable, it is desirable to limit the space required. The depth of the EFEM is also a significant consideration.

Figure 6A:
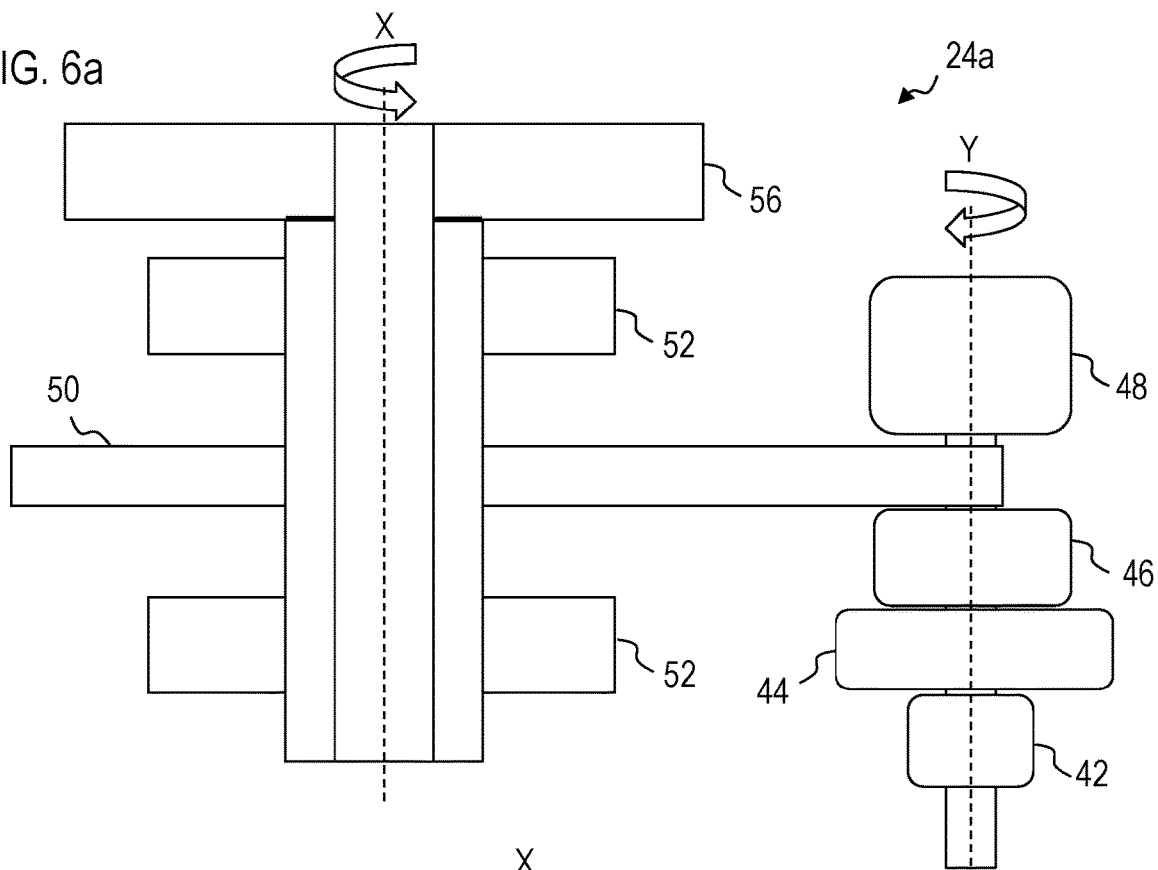
FIG. 6a is partial cross-sectional view of a motor drive arrangement with a gearbox according to an embodiment of the present invention.
Figure 6B:
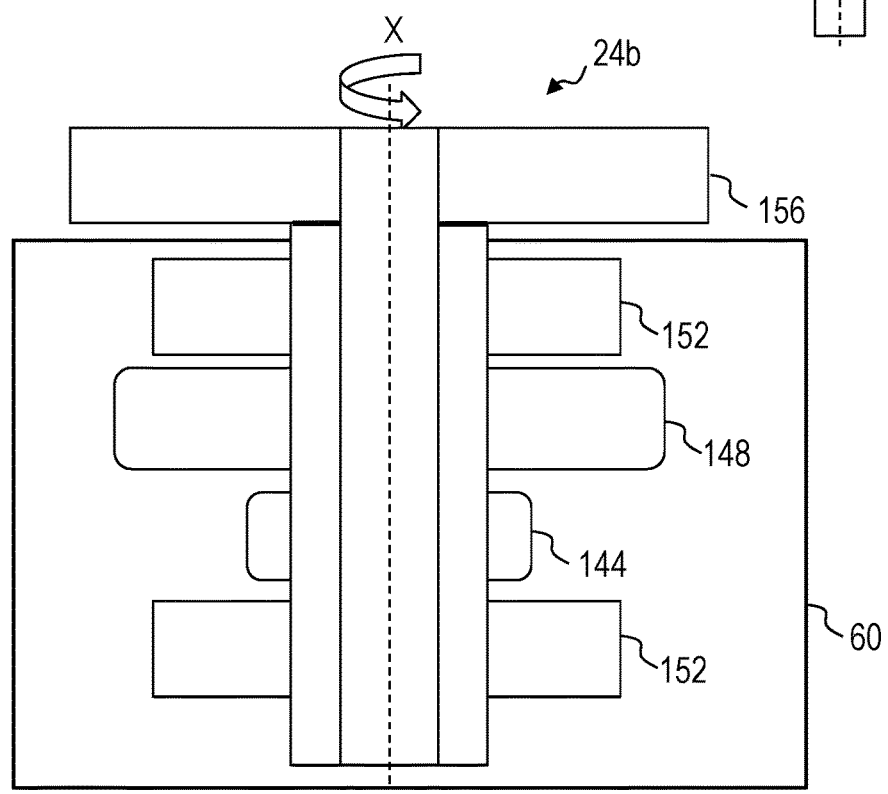
FIG. 6b is a partial cross-sectional view of a direct motor drive arrangement according to an embodiment of the present invention.

FIGS. 6a and 6b are respective exemplary drive units 24A-24D. Each of the drive units in FIGS. 6a and 6b selectively rotate load 56, which corresponds to a respective one of the torso 14, first arm 16, second arm 18, or third arm 20.

FIG. 6a depicts a drive unit 24a which employs an indirect motor arrangement that selectively rotates load 56 about a pivot axis X in the clockwise and counterclockwise directions. The load 56 is secured between bearings 52. A drive gear 50 imparts rotation to load 56 according to the activation of motor 44, which includes a rotor and a stator. Commutation encoder 42 detects the angular position of motor 44 about an axis Y, which is connected to drive gear 50 via a reduction gearbox 46. The angle sensor 48 detects the rotational position of drive gear 50 in accordance with the operation of motor 44 and reduction gearbox 46. Commutation encoder 42 and angle sensor 48 provide control unit 22 with position feedback regarding the position of motor 44 and load 56.

FIG. 6b depicts a drive unit 24b having a direct drive arrangement that rotates load 156 in the clockwise and counterclockwise directions about pivot axis X. The load 156 is secured between bearings 152, which are coaxially disposed with load 156 about pivot axis X. However, bearings 152 can be omitted if desired. Angle sensor 148 is located between bearings 152 in an axial direction along pivot axis X. Angle sensor 148 can be located in other axial positions, provided that it is capable of sensing a position of motor 144 and/or load 156. The angle sensor 148 detects the position of motor 144 and provides position feedback to control unit 22. Angle sensor 148 is disposed adjacent to motor 144 in the axial direction. Motor 144 includes a rotor and a stator and is constituted by a servo motor, for example. The rotor of motor 144 is connected to load 156. The rotor and stator of motor 144 are coaxially disposed about pivot axis X and are located within housings 60 such that separate housings for motor 144 is unnecessary.

As illustrated in FIG. 6b, the direct drive arrangement does not require a reduction gearbox or a commutation encoder. Furthermore, the direct drive arrangement of drive unit 24b provides a more compact configuration by placing bearing 152, angle sensor 148, and motor 144 disposed within housing 60, which is representative of a housing of one of the arm members or of base 66. The direct drive arrangement of drive unit 24b provides the ability to directly sense motor torque and position. A reduction gearbox introduces additional moving parts, such as a drive gear and a driven gear. Manufacturing tolerances in these gears or contamination in the gearbox can result in disturbances and vibration. Therefore, the elimination of reduction gearbox 46 advantageously reduces dynamic disturbances and vibration. The direct drive arrangement of drive unit 24b thereby further minimizes errors during translational motion of torso 14, first arm 16, second arm 18, and third arm 20, improving the accuracy with which substrate W is transported.

Figure 7:
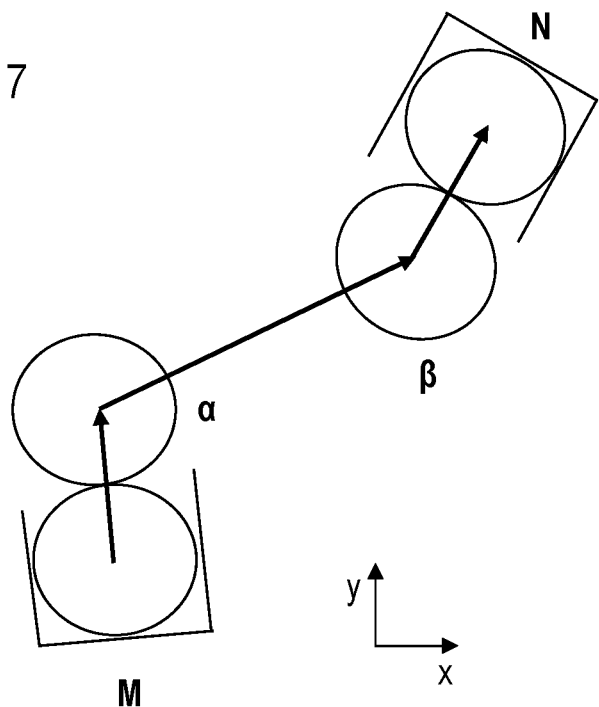
FIG. 7 is a diagram illustrating an exemplary path a robot follows to transport a workpiece according to an embodiment of the invention.

FIG. 7 depicts an exemplary path for transporting a substrate W from an exemplary origin station M to an exemplary destination station N by robot 12 controlled by control unit 22. Acceleration (including deceleration) of third arm 20 and substrate W is limited to the allowable acceleration or less for each of the three exemplary path segments depicted in FIG. 7. Thus, each of the individual path segments as well as the entirety of the overall path, is an example of an acceleration-limited point-to-point motion profile. The acceleration is limited in the point-to-point motion profile to ensure that the substrate W is not subjected to disturbances during acceleration. When third arm 20 supports substrate W on surface S without the use of an end effector, the use of the allowable acceleration avoids unwanted motion of substrate W relative to surface S as the acceleration-limited point-to-point motion profile prevents the acceleration of third arm 20 from generating a reaction force that exceeds a force of friction between substrate W and surface S of third arm 20. This eliminates the need for end effectors such as edge-gripping devices and vacuum devices.

Stations M and N are constituted by FOUPs, process chambers, or pre-aligners, for example, and are similar to stations A-H as depicted in FIG. 3. During transportation, third arm 20, and therefore substrate W, initially have a velocity equal to zero and are at rest within station M. The substrate W is subsequently transported by robot 12 along a first path segment to a safe position $\alpha$ located in a straight-line path from station M. To accomplish this, the surface S and substrate W are accelerated beginning at station M and decelerate and approach safe position $\alpha$. When the substrate W travels from station M to safe position $\alpha$ it has a non-zero velocity. The surface S and substrate W are decelerated (or imparted with negative acceleration) prior to reaching as safe position $\alpha$. The surface S and substrate W can be brought to a full stop (zero velocity) at safe position $\alpha$ at the end of the first path segment, or transition smoothly to a second path segment between safe position $\alpha$ and safe position $\beta$. Control unit 22 controls the transport of substrate W along the second path segment which is a straight line path connecting safe position $\alpha$ and safe position $\beta$. Finally, control unit 22 can decelerate at safe position $\beta$, and subsequently transport substrate W along a third path segment to station N. Surface S and substrate W can be brought to a full stop at safe position $\beta$, or can transition smoothly to the third path segment between safe position $\beta$ and station N. Prior to controlling the drive units (e.g., drive units 24A-24D) to impart motion to robot 12, control unit 22 determines a motion profile to achieve transport of substrate W along a series of points, as exemplified by the path depicted in FIG. 7.

An acceleration to transport substrate W along the exemplary path from safe position $\alpha$ to safe position $\beta$ of FIG. 7 will now be described. Control unit 22, employing acceleration limit unit 104, determines an allowable acceleration with which to transport substrate W. The allowable acceleration is a maximum acceleration permitted during at least one of the path segments as measured at surface S of third arm 20 or substrate W. The allowable acceleration can be a predefined value stored in acceleration limit unit 104 within memory 114, the predefined value based on experimental or simulation results, for example. The allowable acceleration can also be specified by a user via input device 36, allowing a user to set a particular desired value for the allowable acceleration, either by inputting a particular desired acceleration value, or by adjusting the predefined value for the allowable acceleration upward or downward.

Acceleration can change during transportation of substrate W. The change in acceleration, jerk, is the time derivative of acceleration. For example, an instantaneous change in acceleration results in infinite jerk. A desired value for allowable jerk, the change in acceleration over time, can be specified in the same manner as acceleration. The allowable jerk can also be determined based on the value of the allowable acceleration and a specified time constant of a moving average filter. The moving average filter allows for the calculation of acceleration and jerk based on a limited number of data points. The time constant of the moving average filter represents the time period covered by the moving average filter, or a number of data points covered by the moving average filter.

The control unit 22 generates a path along a series of points, ensuring that the acceleration of third arm 20 and substrate W does not exceed the allowable acceleration. The path from safe position α to safe position β with this allowable acceleration is an example of an acceleration-limited point-to-point motion profile generated by control unit 22, and can be calculated in Cartesian coordinate space, for example. The path from station M to safe position α is another example of an acceleration-limited point-to-point motion profile. A similar procedure is followed to calculate an acceleration-limited point-to-point motion profile to transport substrate W from safe position β to station N. Also, an entirety of the path, including the above-described first, second, and third path segments, is an example of an acceleration-limited point-to-point motion profile. During the operation of robot 12 according to the acceleration-limited motion profile, control unit 22 continuously monitors the position of each of the arms 16, 18, and 20, and torso 14 based on sensor 120, encoder 42, and/or angle sensors 48, 148. The generation of a point-to-point motion profile is based on a path of substrate W on third arm 20, as discussed in greater detail below with respect to FIG. 10.

Control unit 22 can also assume a rotational acceleration imparted to substrate W, and calculate an acceleration available to accelerate by taking the rotational acceleration imparted to substrate W into account, ensuring that the acceleration does not exceed the allowable acceleration. This relationship can be represented by the following formula (1):

$$a + \frac{1}{2}R^2\frac{\alpha}{r} < \mu g. \tag{1}$$

In formula (1), a represents linear acceleration, R represents the radius of the substrate W, α represents a rotational acceleration, r represents a radial position of a contact point between the surface S and substrate W, μ represents the coefficient of static friction between the surface S and substrate W, and g represents the force of gravity.

Furthermore, the relationship between linear acceleration and rotational acceleration can be represented by the following formula (2):

$$a + \frac{1}{2}R^2\frac{\alpha}{r} < \mu\left(g + \frac{d^2z}{dt^2}\right). \tag{2}$$

In formula (2), a, R, α, r, μ, and g represent the variables described above, and $$\frac{d^2z}{dt^2}$$

represents the acceleration in a third (vertical) direction that is aligned with a direction of the force of gravity. As can be appreciated, as acceleration occurs in an upward direction, a force of friction between surface S and substrate W increases, resulting in an increase in allowable acceleration in a horizontal direction, represented by a. Conversely, when acceleration occurs in a downward direction, less friction occurs between surface S and substrate W, reducing the allowable acceleration a in the horizontal direction. Therefore, the allowable acceleration can be employed to control transport of substrate W in two dimensions or in three dimensions, and can take the relationship between rotational and linear acceleration into account.

Control unit 22 can reduce the allowable acceleration based on an expected rotational acceleration of substrate W when a path of the substrate W changes direction or follows a non-linear path segment. As can be appreciated, many paths including at least three points are at least partially non-linear. Preferably, the entire motion from station M to Station N is preferably performed in as short a time as possible without exceeding the allowable acceleration, even when control unit 22 reduces allowable acceleration based on an expected or calculated rotational acceleration component.

Semiconductor wafer handling, among other applications, requires the surface S to start at one position and end at another. The shortest distance between two points is a straight line but in many cases, the arms must move around obstacles. For example, as illustrated by the dotted line 180 in FIG. 3, a substrate W can move from station A and into the FI along a path that includes a line segment 182 and an arc or curve 184. Then, the substrate W must move within the FI to the position of station H by continuing along the arc or curve 184 and proceeding along another line segment 186 to the destination at station H. The exemplary path in FIG. 3 thus includes straight line segments 182, 186 and an arc 184. As illustrated in FIG. 7, a path formed by a series of straight lines can be employed. Thus, any series of line segments, arcs, curves, and parabolas can form the path.

In certain methods, a path is determined by blending adjacent segments together. The vector summation of the accelerations for the path segments necessarily results in an acceleration with a magnitude greater than those of the original linear path segments. In order to stay within an allowable acceleration, it is necessary to reduce the acceleration along the original linear path segments. The acceleration will peak during the convergence of the two path segments.

During the exemplary transfer process depicted in FIG. 7, no restriction is placed on the velocity with which the substrate W is transported, but rather the acceleration and jerk of the third arm 20 and/or the substrate W is restricted. The acceleration of substrate W along the path from station M to safe portion α, from safe portion α to safe position β, and from safe position β to station N can be limited in the point-to-point motion profile in the manner described above. The acceleration-limited point-to-point motion profile and the allowable acceleration are calculated so as to minimize the amount of time necessary to transport substrate W, while ensuring that the acceleration does not disturb substrate W. The motion of third arm 20 and substrate W can be performed such that the x-component and y-component of the move complete at the same time. The starting velocity, final velocity, positions, and accelerations along the path are used to calculate equations for move time of the x-component and y-component. The move time can be calculated for each individual segment (e.g. line segment, arc or curve segment, etc.) The sum of the move times for each segment provides a total move time from an origin position, such as station M, to a destination position, such as station N. Thus, a minimum possible total move time is realized in which the allowable acceleration is not exceeded and movement in the x-direction and y-direction is completed simultaneously.

The motion profile and path can be constituted by lines, curves, arcs, parabolas, or any combination of these. When the path includes a curve, arc, or parabola, a second path segment can be started before the first path segment is completed.

A path can be constituted by a series of line segments that are connected by via points. A velocity out of an origin station is non-zero and is collinear with a line extending from the origin station. A velocity into the destination station can be non-zero and is collinear with a line extending into the destination station.

A path can also be formed by a series of line segments and arcs that join each other at via points. The radius of curvature of the arc can be determined based on the allowable acceleration and by the velocity at the via point at which the line segment and the arc connect.

When the path includes a series of line segments and arcs or curves, a non-zero velocity can be attained at the end of each line segment that converges into an arc. The motion profile can be manipulated to avoid an instantaneous change in acceleration and accelerate at or below the allowable acceleration. As illustrated in FIG. 7, a series of line segments can be connected by points, as illustrated at safe position α and safe position β. The path of FIG. 7 includes a velocity from station M in which velocity can be non-zero and is collinear with a line extending from station M. However, the path segments can include a series of line segments and arcs or curves, similar to the path indicated by the dotted line 180 in FIG. 3. Thus, a path from station M to safe position α can include a series of line segments and arcs. Similarly, the path between safe position α and safe position β, and the path between safe position β and station N can include a series of line segments and arcs. When arcs or curves are included in a path or a part of the path, a radius of curvature of the arcs or curves is determined according to the velocity at the intersection of the line segment and arc, and the allowable acceleration.

As illustrated in the dashed lines 192, 194, 196 in FIG. 3, robot 12 can move without a substrate W. The allowable acceleration can be ignored when third arm 20 moves without a substrate W. This type of movement occurs when third arm 20 withdraws from a destination station, for example. When operating in this manner, acceleration and velocity is limited by the operational capabilities of the drive units. Alternatively, a second allowable acceleration can be employed when robot 12 moves without a substrate, the second allowable acceleration being higher than the allowable acceleration used when a substrate W is present on the surface of third arm 20.

The acceleration-limited motion profile provides secure and efficient transfer of substrate W by ensuring that reaction forces resulting from the acceleration of substrate W do not overcome the static friction force between the substrate W and the surface of third arm 20. When direct drive units are used for the drive units, reliability can be further improved. As discussed above, direct drive units can avoid issues caused by velocity ripple or other disturbances. This can allow for a higher acceleration, as acceleration forces introduced by disturbances to substrate W are reduced by such a configuration. Furthermore, the use of high-friction materials or coatings increase the force of friction between surface S and substrate W, allowing for a further increase in allowable acceleration. Examples of such materials are rubbers and perfluoroelastomers. These and other acceptable materials can be used to construct surface S of third arm 20 or applied as a coating. Of course, any material or coating used with surface S of third arm 20 should prevent contamination and not otherwise damage the substrate W.

Figure 8A:
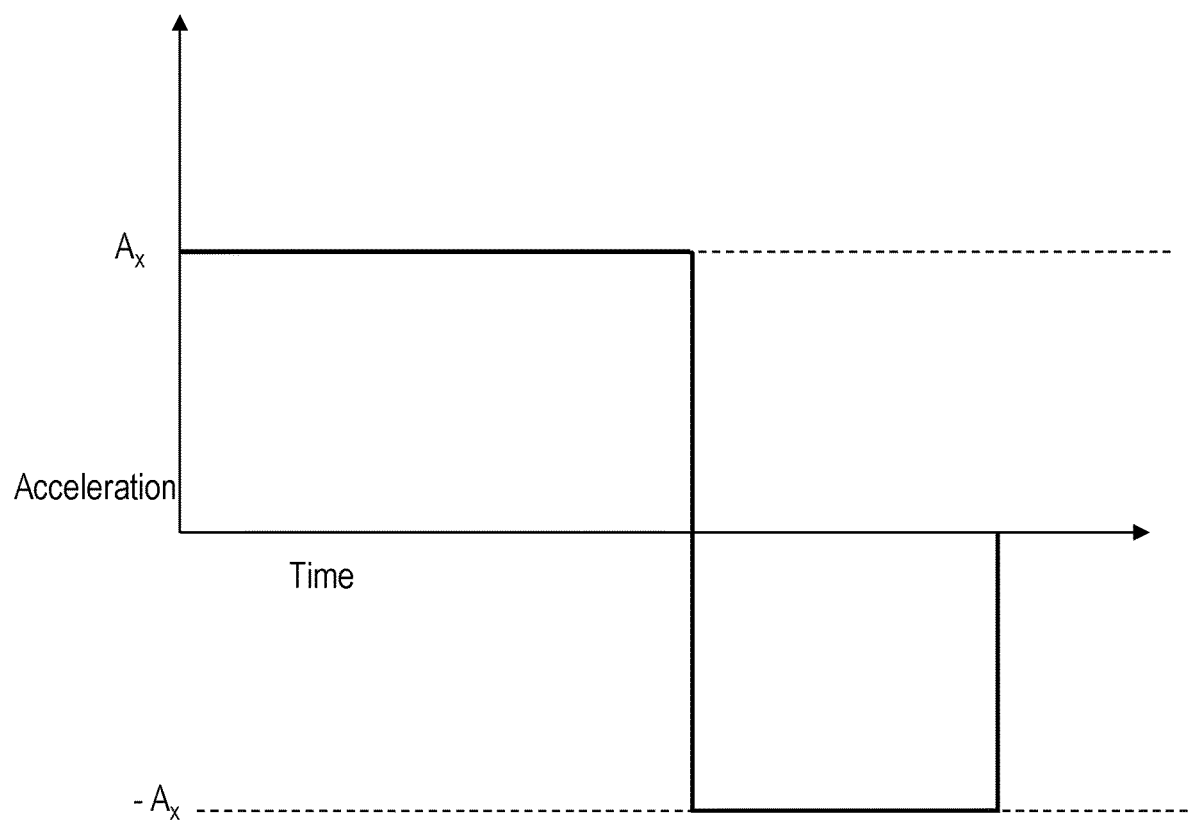
FIG. 8a is a chart illustrating acceleration vs. time when an axis of a robot is controlled according to an embodiment of the present invention.

FIG. 8a provides an exemplary chart representing of an acceleration-limited point-to-point motion profile for an x-axis. As illustrated FIG. 8a, acceleration is permitted to reach allowable acceleration $A_x$, which represents a one-dimensional acceleration. The acceleration $A_x$ can be determined by taking into account the assumed rotational acceleration and an initial allowable acceleration that is predefined or set by a user. Allowable acceleration $-A_x$ in FIG. 8a represents the allowable acceleration as applied to the opposite direction (deceleration), also parallel to the x-axis.

In the example of FIG. 8a, motion is assumed to occur entirely along a straight path parallel to the x-axis. However, when acceleration occurs in both x- and y-axes, as in FIG. 7, the allowable acceleration can be implemented as the vector sum of the x- and y-acceleration components. When the allowable acceleration is implemented as a vector in Cartesian coordinates it has non-zero values for each of the x- and y-components except when the vector is parallel with the x- or y-direction. Therefore, an exemplary allowable acceleration $A_{lim}$ can be represented as $A_{lim}=A \cos(\theta)+A \sin(\theta)$. Of course, the allowable acceleration can also be determined for three-dimensions when vertical movement of substrate W is performed.

Also, allowable accelerations can be independently defined for each of the dimension components in which robot 12 is configured to move third arm 20. Thus, acceleration limit unit 104 can provide individual allowable accelerations for an x-axis, a y-axis, and a z-axis. Coordinate systems other than Cartesian coordinates can also be utilized with control unit 22 and acceleration limit unit 104.

Figure 8B:
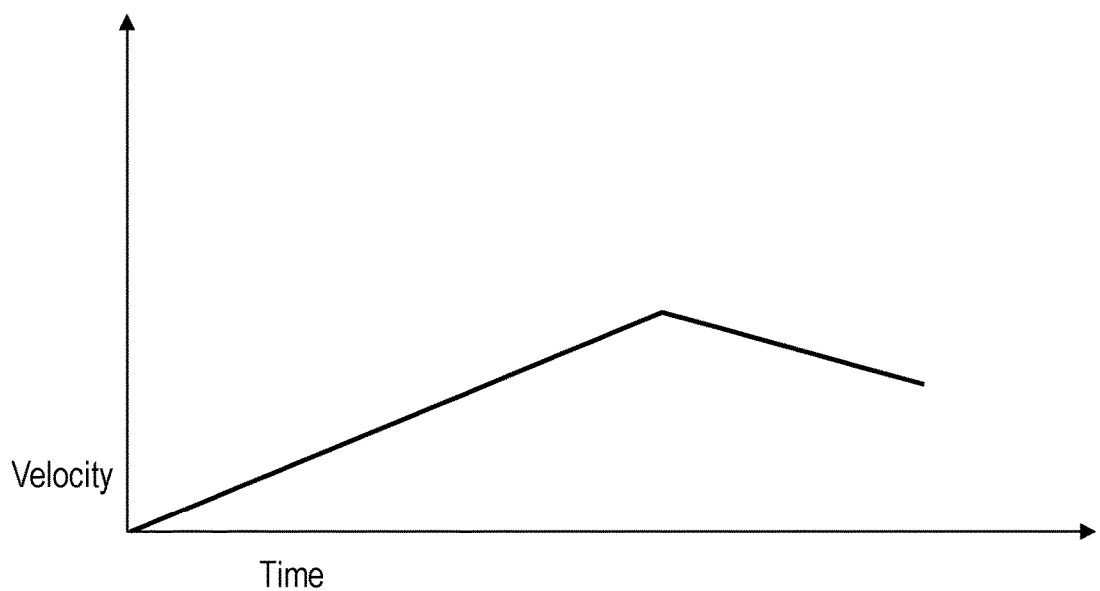
FIG. 8b is a chart illustrating velocity vs. time when an axis of a robot is controlled according to an embodiment of the present invention.

FIG. 8b illustrates an exemplary chart representing of velocity over time in accordance with the acceleration illustrated in FIG. 8a. This velocity can be determined by control unit 22 based on the previously-determined acceleration performed at allowable acceleration $A_x$ and $-A_x$, by integration, for example. Further integration of the velocity profile can be performed by control unit 22 to determine position over time. In this manner, the allowable acceleration can be used in order to determine joint commands and the corresponding operation of each of the drive units by control unit 22 by inverse kinematics. The control unit 22 is further configured to evaluate the time necessary to perform a particular transfer of substrate W in accordance with an acceleration-limited point-to-point motion profile.

Figure 9:
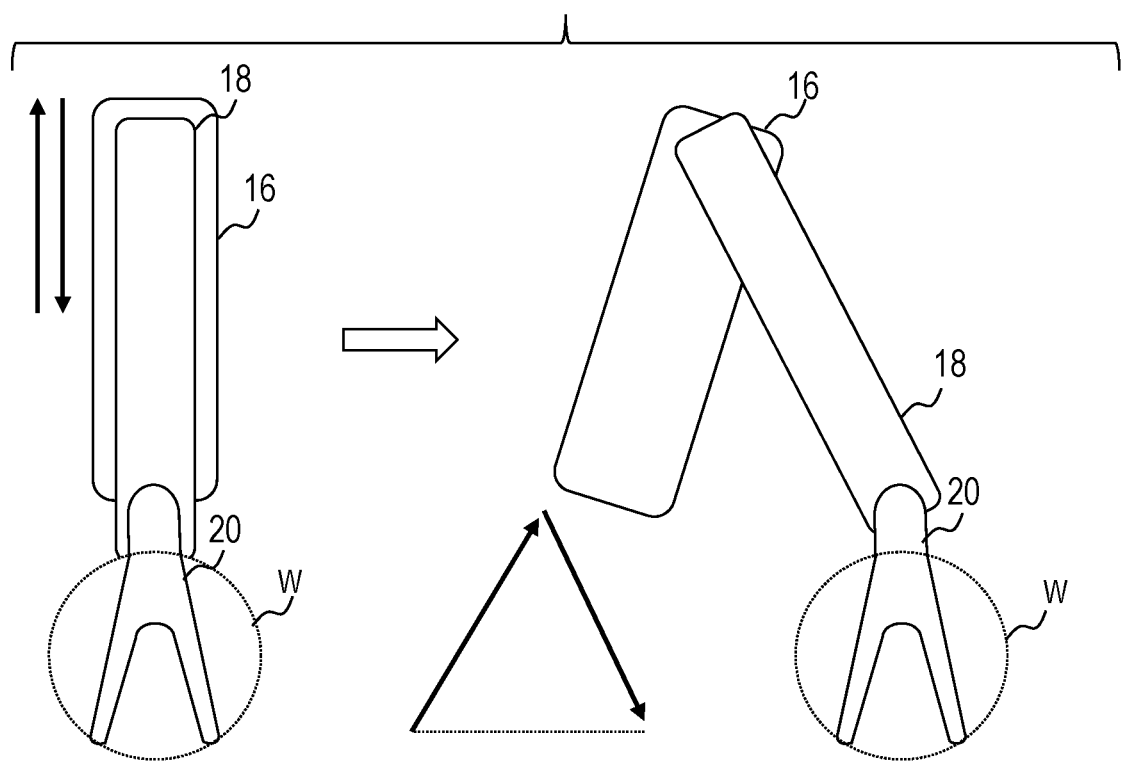
FIG. 9 is a schematic illustrating a motion of two arm members through a singularity according to an embodiment of the present invention.

FIG. 9 illustrates a singularity condition in which a first one of the arms 16, 18, 20, or torso 14 of robot 12 is located parallel relative to a second one of the arms 16, 18, 20, or torso 14 of the robot 12 such that these units overlap. In order to effectively transfer substrate W, control unit 22 is configured to command the arms 16, 18, 20 and/or torso 14 to move the substrate W along a path that is orthogonal to each of these elements as depicted in FIG. 9. This can avoid an unnecessarily high rate of acceleration, and also prevents velocity ripple which can be introduced at the singularity condition.

Figure 10:
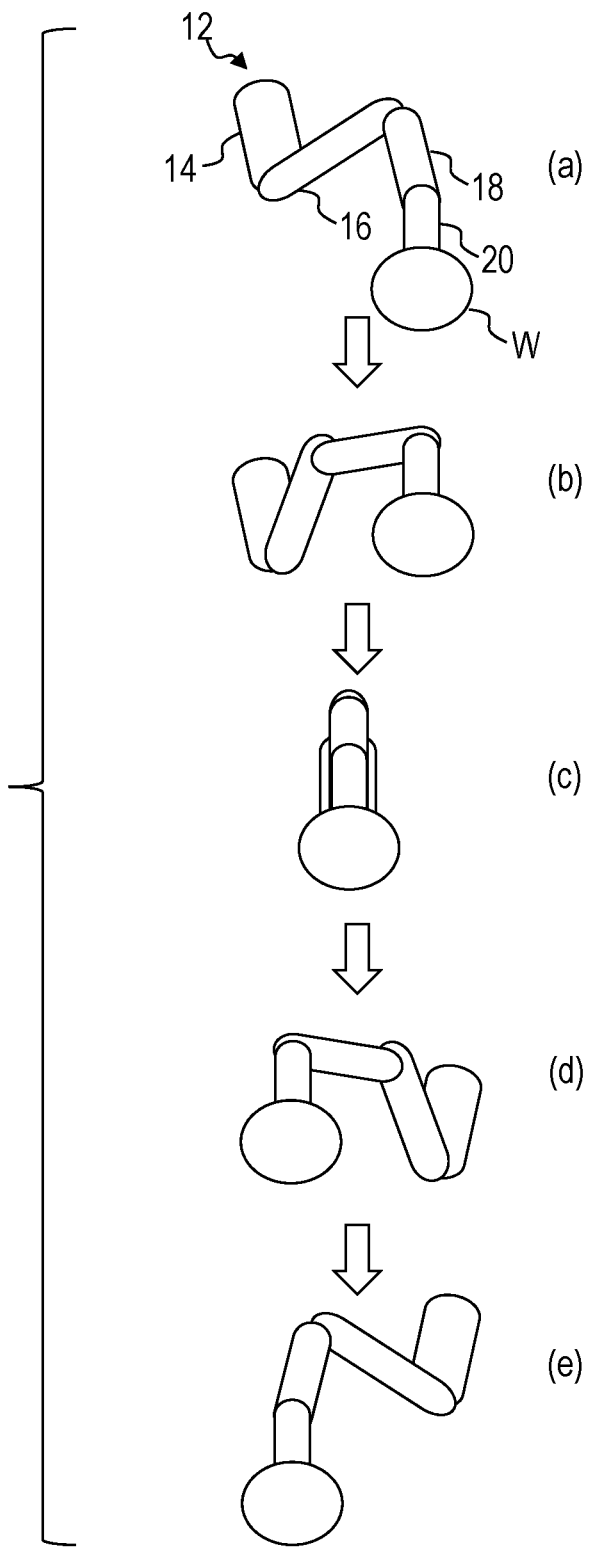
FIG. 10 is a schematic view of various postures of a robot controlled by a control unit when transporting a workpiece according to an embodiment of the invention.

FIG. 10 provides a schematic view of an exemplary series of postures of robot 12 during transfer of substrate W in accordance with the acceleration-limited point-to-point motion profile. The substrate W is first transported from an initial position to a safe position, as exemplified by the transition from (a) to (b) in FIG. 10. The substrate W is then moved along a linear path to a neutral position approximately in the center of the range of motion of robot 12, as represented by (c) and corresponding to a singularity condition. The robot 12 then proceeds along the same linear path to a second safe position as depicted in (d), subsequently extending the substrate W into a destination position in (e). The entire process from (a) to (e) can be performed in accordance with the acceleration-limited point-to-point motion profile. Alternatively, only the movement along the linear path from (b) to (d) is performed based on the acceleration-limited point-to-point motion profile.

FIG. 10 also depicts a robot 12 provided with torso 14 for greater reach. Thus, robot 12 of FIG. 10 provides arms 14 and a third arm 20 that provide three degrees of freedom, while torso 14 provides a fourth degree of freedom.

Figure 11:
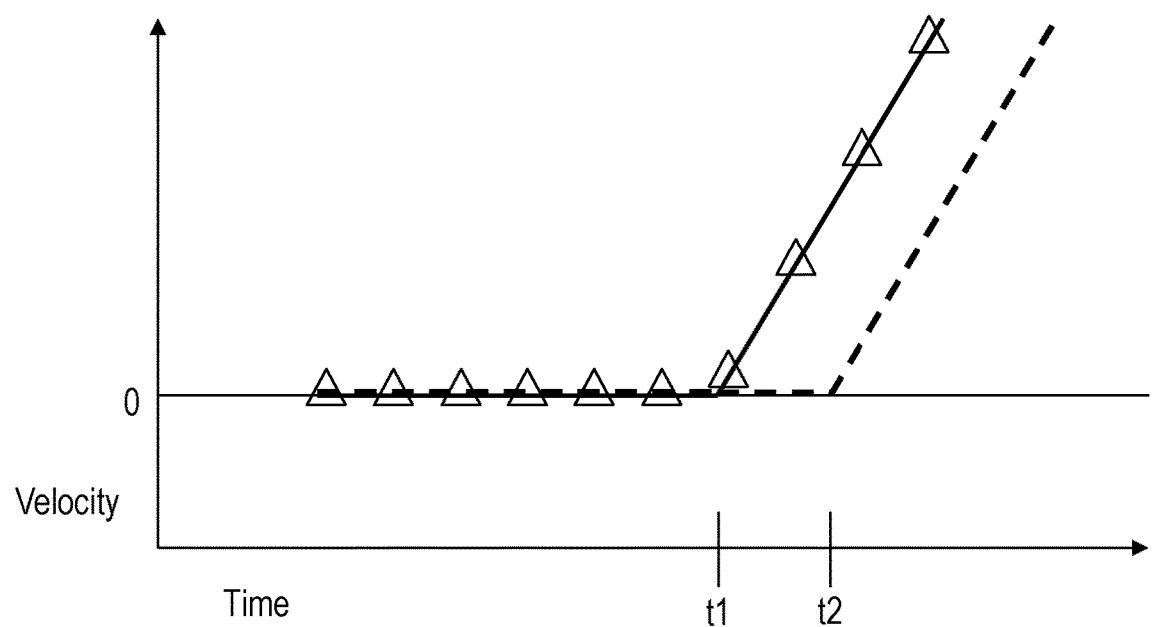
FIG. 11 is a diagram illustrating velocity vs. time when backward differencing and forward differencing methodologies are employed to control robot arm members in Cartesian coordinates according to an embodiment of the present invention.

FIG. 11 is a diagram comparing results obtained when using backward differencing and forward differencing methods in control unit 22. In FIG. 11, velocity is plotted over time. The solid line in FIG. 11 represents velocity achieved in response to a command issued at time t1. The solid line corresponds to forward differencing, while the dashed line corresponds to backward differencing. As can be seen in FIG. 11, the velocity achieved by forward differencing overlaps the commanded velocity, which is represented by the series of triangles. The use of backward differencing introduces delay. Therefore, a closed-loop proportional integral derivative (PID) responds to correct errors introduced by this delay. Thus, there is a further delay introduced in accordance with the oscillation introduced by closed-loop PID control. This resulting delay time is depicted in FIG. 11 by the difference between t1 and t2.

Figure 12:
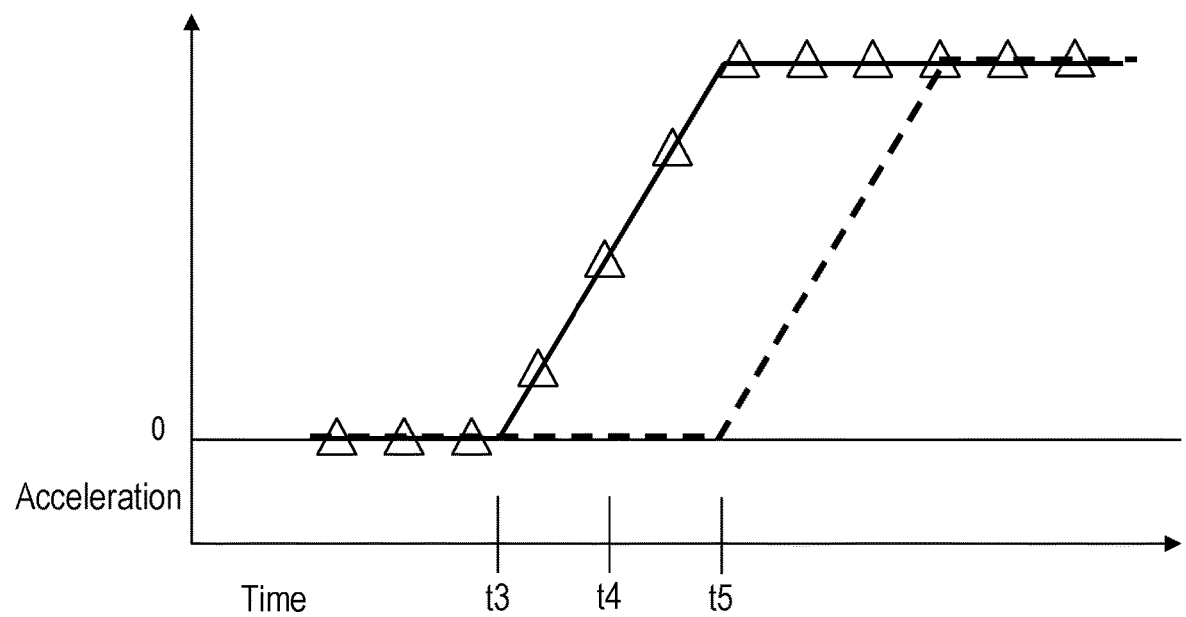
FIG. 12 is a diagram illustrating acceleration vs. time when backward differencing and forward differencing methodologies are employed to control robot arm members in Cartesian coordinates according to an embodiment of the present invention.

FIG. 12 is another diagram comparing results obtained when using backward finite differencing and forward differencing methods. As in FIG. 11, triangles in FIG. 12 represent commanded acceleration while the solid line corresponds to acceleration achieved by forward differencing. The dashed line corresponds to backward differencing. As illustrated in FIG. 12, backward differencing methodologies can introduce an error represented by the difference between t3 and t5, which is twice the magnitude of the difference between t1 and t2 in FIG. 11.

As depicted in FIGS. 11 and 12, feed forward control employing forward differencing allows motion commands to avoid error introduced by closed-loop PID control. Thus, error is eliminated even when control unit 22 controls the motion of robot 12 by using a path of substrate W as the basis for determining position, velocity, acceleration and thus the torque for each of the arms, torso, etc., of robot 12. In order to accomplish forward differencing, position in a current time, position in a future time, and position in a still farther future time can be used to determine velocity and acceleration in the respective present and future times for a planned substrate transportation.

Figure 13:
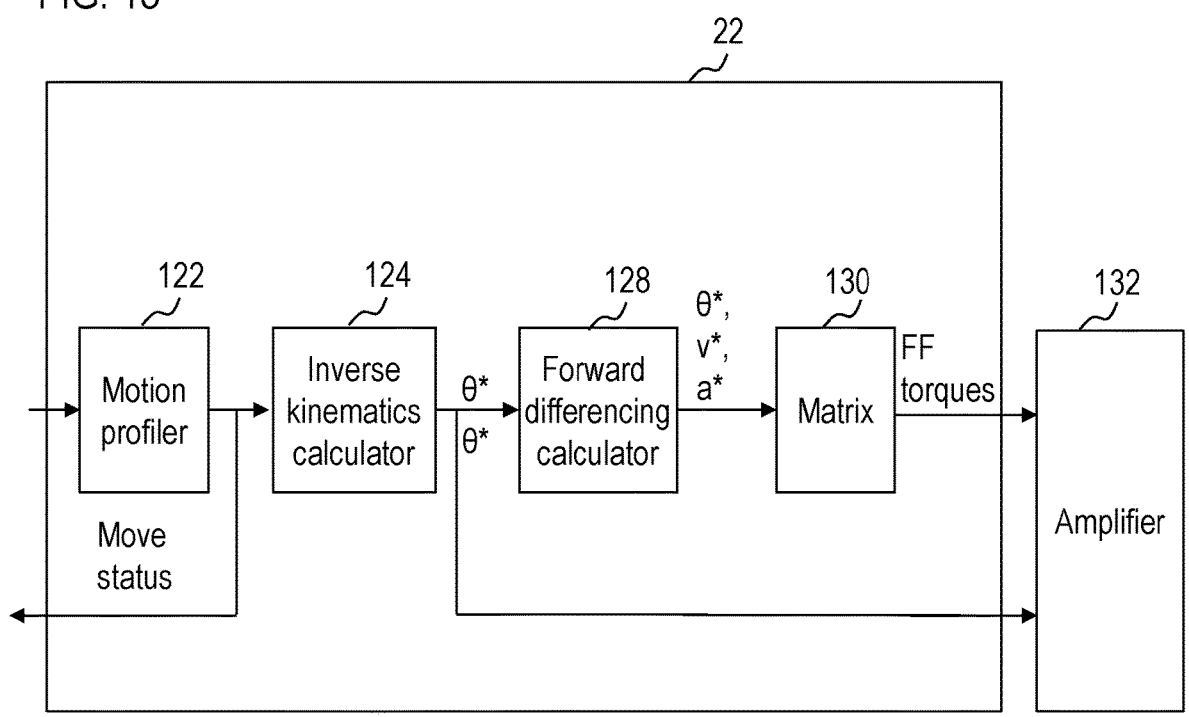
FIG. 13 is a block diagram illustrating a control methodology according to an embodiment of the present invention.

A control methodology performed by control unit 22 when employing forward differencing will now be described with reference to FIG. 13. FIG. 13 provides a block diagram illustrating the generation of commands for drive units 24A-24D by control unit 22 in order to transfer substrate W in accordance with the acceleration-limited motion profile. Motion profiler 122 receives information with respect to a starting position, a destination position, as well as current position information for each of the arm members and the third arm 20 of robot 12. This information is received, for example, from a high-level controller. The motion profiler outputs a move status to the high-level controller, the move status including an indication that a move has been completed, for example. An inverse kinematics calculator 124 is configured to determine required joint angles for each of the arm members based on the position and orientation of third arm 20 and the allowable acceleration from acceleration limit unit 104, and outputs corresponds joint angle commands θ*. The inverse kinematics calculator 124 can perform this determination in Cartesian coordinates. Thus, the path of the third arm 20 and substrate W is used as a starting point in order to determine the necessary joint angles to move the substrate within the allowable acceleration determined by acceleration limit unit 104. Thus, the allowable acceleration is taken into consideration by the inverse kinematics calculator to ensure that the allowable acceleration not exceeded. In order to minimize time necessary to complete a move, inverse kinematics calculator determines joint angle commands θ* that provide acceleration approximately equal to the allowable acceleration for as long as possible.

The joint angle commands θ* output from inverse kinematics calculator 124 correspond to the joints formed between each of the arm members and between a distal arm 16 and third arm 20. Forward differencing calculator 128 receives these joint angle commands θ* and performs forward differencing in order to calculate a corresponding velocity command v* and acceleration command a* for feed forwarding. The velocity command v* and acceleration command a* are output along with joint angle commands θ* to matrix 130 which is used to transform these values into drive unit torque values. Matrix 130 can be a table stored in advance in memory 114, for example. The drive unit torque values output from matrix 130 are feed forward torques (FF torques) output to amplifier 132. The amplifier 132 also receives the joint angle commands θ* from inverse kinematics calculator 124. The amplifier 132 generates commands for each of the drive units 24A-24D based on the joint angle commands θ* from inverse kinematics calculator 124 and feed forward torques from forward differencing calculator 128 and matrix 130. Thus, commands can be issued by amplifier 132 without the error and oscillation introduced by closed-loop PID control. Closed-loop PID control responds to errors associated with disturbances. The feed forwards serve to cancel such disturbances so that there is reduced position velocity error corrected by the PID loop.

Figure 14:
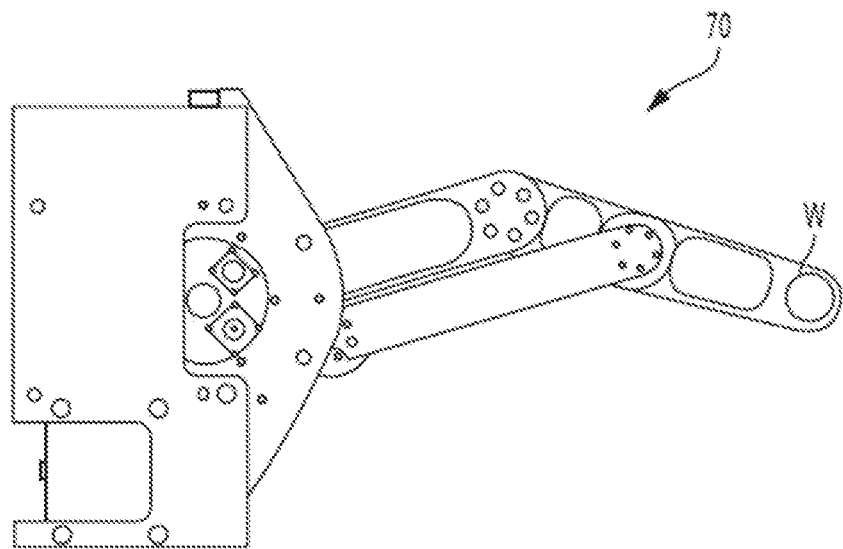
FIG. 14 is a plan view of a four bar link robot according to an embodiment of the present invention.
Figure 15:
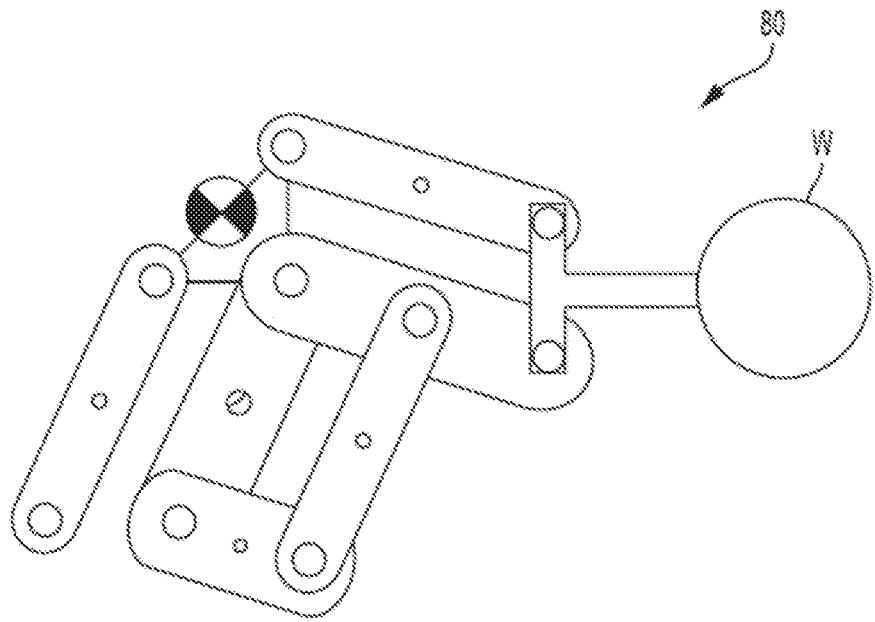
FIG. 15 is a plan view of an eight bar link robot according to an embodiment of the present invention.

FIGS. 14 and 15 provide plan views of a four bar link robot 70 and an eight bar link robot 80, according to second and third embodiments of the present invention. The four bar link robot 70 and the eight bar link robot 80 can be configured with drive units configured in an indirect arrangement or in a direct arrangement according to FIGS. 6a and 6b. Four bar link robot 70 and eight bar link robot 80 can each be controlled by control unit 22 such that transportation of substrate W can be performed in accordance with an acceleration-limited point-to-point motion profile, with or without the use of edge-gripping or vacuum device end effectors.

A method for transferring a substrate using a robotic handling device 10 will now be described with reference to FIG. 16. First, in step S102, to location of third arm 20, an arm member having substrate surface S, is determined and compared to a starting position. If the third arm 20 is not located at a starting position for a desired transportation, the process returns and the determination of step S102 is performed again. When the third arm 20 is located at a starting position, for example a position within a station in which a substrate W is supported on third arm 20, the determination is affirmative and the process proceeds to step S104.

In step S104, an allowable acceleration for substrate W is determined by control unit 22, in accordance with acceleration limit unit 104. The allowable acceleration can be a value representing acceleration itself, or a value representing a change in acceleration over time (jerk). The determination of the allowable acceleration can be performed in the manner discussed above. This allowable acceleration can be provided by a user or predefined by the acceleration limit unit 104. When the allowable acceleration is predetermined, it can be stored in memory 114 with acceleration limit unit 104. When the allowable acceleration is set by a user, the user can enter a numerical value for the allowable acceleration by interacting with input device 36 and observing display 34.

The allowable acceleration determined in step S104 can be the predefined or user-defined allowable acceleration or can take into account an assumed rotational acceleration of substrate W when moving from the starting position. To take rotational acceleration into account during step S104, control unit 22 can reduce the allowable acceleration based on an expected rotational acceleration of substrate W, especially when a path of the substrate W changes direction or follows a non-linear path segment. The allowable acceleration can be limited to a linear acceleration in Cartesian coordinate space.

In step S106, a path for the third arm 20 and substrate W is determined or calculated by control unit 22. This path can be characterized by straight lines connecting a series of points, as illustrated in FIG. 7, for example, constituted by arcs, parabolas, and curves, or some combination of each. This path is limited to the allowable acceleration and forms an acceleration-limited point-to-point motion profile. The accelerations employed during the motion profile can be substantially equivalent to the allowable acceleration for a maximum possible time in order to reduce the time needed for transporting the substrate W. The determination of a path in step S106 is performed in the manner described above with respect to FIGS. 7 and 13 and can include a series of accelerations, decelerations, and changes in directions. Thus, the path generated in step S106 corresponds to an acceleration-limited point-to-point motion profile.

Velocity and position of the third arm 20 and/or substrate W can be determined in step S108 based on the acceleration-limited point-to-point motion profile. Step S108 can be performed by integration of acceleration over time to determine velocity. Integration of velocity over time can be implemented in step S108 to obtain position over time. Also, inverse kinematics calculator 124 can be employed to determine joint angles and corresponding commands for each of the arm members and the third arm 20 in step S108.

Based on the calculations of step S108, in step S110 each of the drive units 24A-24D is controlled by commands (joint angle commands θ*) issued from control unit 22, according to the acceleration-limited point-to-point motion profile. During step S110 each of the drive units is controlled by control unit 22 to move torso 14 and arms 16, 18, and 20 about respective pivot axes. Position feedback from the drive units themselves and/or from external sensor 120 allows control unit 22 to precisely control the movement of each of the arm members and substrate W.

The process then proceeds to step S112, where the control unit 22 determines whether third arm 20 is located at a destination position, which can be a destination station, alignment station, or other position within or attached to an EFEM or FI 150. If the determination in step S112 is negative, the process returns to step S110 to continue driving the drive units to transport substrate W. If the determination in step S112 is affirmative, the process proceeds to step S114. In step S114, control unit 22 controls third arm 20 to deliver substrate W to a processing station if necessary. For example, third arm 20 is brought into vertical motion in order to transfer substrate W to a processing chamber. Third arm 20 can then be withdrawn as represented by the dashed-line paths 192, 194, 196 of FIG. 3, for example. Once this transfer of substrate W is completed, if necessary, the process is completed. Alternatively, the process can be completed immediately once the third arm 20 is located at the destination position in step S112.

Figure 16:
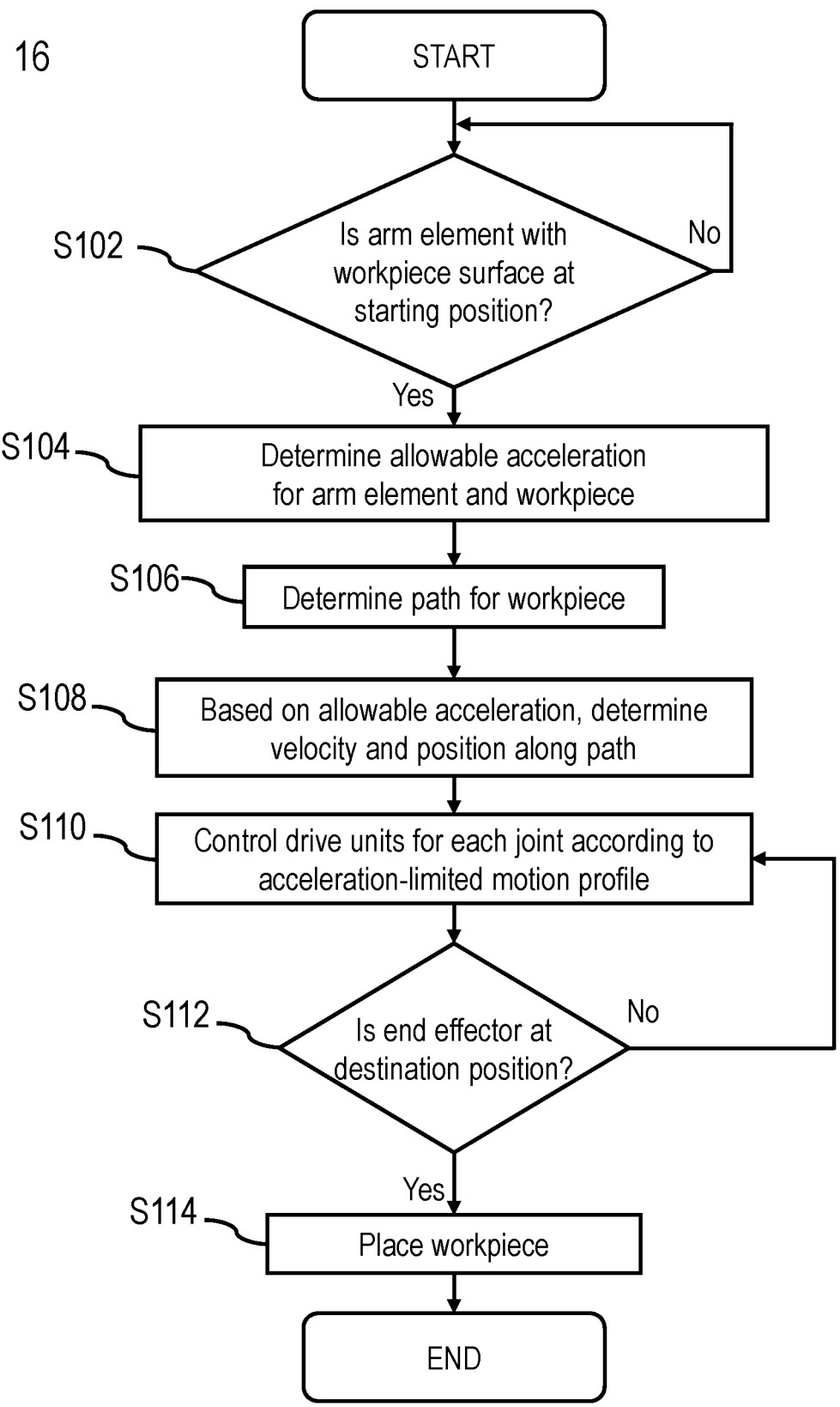
FIG. 16 is a flowchart illustrating an exemplary process for transporting a workpiece according to an embodiment of the present invention.

The above-described process of FIG. 16 can be repeatedly performed in order to perform multiple transfers of one or more substrates W, for example, to perform the transport and transfers depicted in FIG. 3.

The allowable acceleration can be applied when arms 16, 18, 20 of robot 12 are brought into motion while a substrate W is present on third arm 20. When no substrate W is present on third arm 20, control unit 22 is configured to operate without limiting acceleration, or can alternatively apply an allowable acceleration with a higher allowable acceleration.

Robots 12 that employ end effectors such as edge-gripping devices and/or vacuum features potentially introduce contamination to the underside of a semiconductor wafer. They can increase the presence of contaminants including particulate matter. Vacuum-gripping end effector features are particularly susceptible to the introduction of contamination. Edge-gripping end effector devices sometimes cause abrasion to the edges of the semiconductor wafer. These devices also increase cost and complexity. Furthermore, multi-axis robots require a plurality of drive units to impart motion at respective joints. However, indirect drive units can introduce additional disturbances during acceleration and deceleration. These disturbances can be avoided by using of direct drive units for the drive units. The combination of direct drive units located within housings and the acceleration-limited motion profile increase the reliability of third arm 20 that controls the transportation of substrate W solely with surface friction between surface S and substrate W such that handling of the substrate on the third arm 20 is performed without the use of suction and without edge gripping. The direct drive motors and acceleration-limited motion profile also reduce the disturbances experienced by the third arm 20 and substrate W. Additionally, disturbances are even further reduced by controlling the drive units with forward differencing and feed forwarding rather than rely solely on closed-loop PID control. Thus, reaction forces resulting from the acceleration of substrate W do not overcome the force of friction between the substrate W and the surface of third arm 20 supporting the substrate W. The use of the direct drive motor, the acceleration-limited motion profile, and the forward differencing and feedforward control together significantly reduces the risk of abrasion and contamination, while efficiently transporting and transferring the substrate W to reduce processing time.

While the above-described embodiments have been mostly described with respect to movement within a plane (two-dimensional movement) for simplicity of explanation, three-dimensional movements and substrate transportation employing the above-described features are also possible. Three-dimensional moves can be more reliably and safely performed by employing an acceleration-limited point-to-point profile and forward differencing control.

While the above-described embodiments provide an acceleration-limited point-to-point motion profile in which no limit is placed on velocity, control unit 22 can also be configured to include a velocity limit. The velocity limit can also be modified or set by a user via input device 36.

The above-described embodiments mainly describe transportation of a substrate W. However, transportation, transfer, and manipulation of a variety of different workpieces with various sizes, shapes, and components are possible. Transportation and transfer of various workpieces can include picking, placing, assembly, and other manipulations of workpieces performed by robot 12. These workpiece transportation or transfer processes can be performed in a variety of different working environments including open-air or enclosed locations. Robot 12 can be freestanding, provided on a track 28, or mounted to a support structure such as a wall, ceiling, support frame, etc.

Advantageously, an acceleration-limited motion profile minimizes the acceleration imposed on a substrate W while achieving the fastest move time. When either vacuum devices or edge-gripping devices are employed, the force resulting from the acceleration of the mass of the wafer does not exceed the friction force between the surface S and the substrate W, avoiding damaging the substrate W due to slippage. With edge-gripping devices, constraint forces applied to the wafer by the edge-gripping device are advantageously reduced by limiting the acceleration. Thus, the forces applied by the edge-gripping device to the substrate W are reduced, further avoiding damage to the substrate W.

It should be noted that the exemplary embodiments depicted and described herein set forth the preferred embodiments of the present invention, and are not meant to limit the scope of the claims hereto in any way. Numerous modifications and variations of the present invention are possible in light of the above teachings. It is therefore to be understood that, within the scope of the appended claims, the invention may be practiced otherwise than as specifically described herein.

What is claimed is:

1. A robotic apparatus comprising:
a first arm member configured to pivot about a first axis;
a second arm member pivotably connected to the first arm member, the second arm member having a surface upon which a workpiece can be received;
a first drive unit configured to drive the first arm member to pivot about the first axis; and
a control unit configured to control the first drive unit to move the surface of the second arm member to transport the workpiece, the control unit being configured to control the first drive unit such that the surface is not moved at an acceleration value that exceeds a predetermined acceleration limit during the transport of the workpiece,
wherein the control unit is configured to control the first drive unit without exceeding the predetermined acceleration limit at the surface to retain the workpiece solely with surface friction between the surface and the workpiece such that transport of the workpiece while on the surface of the second arm is performed without use of a suction device and without use of an edge gripping device.

2. The robotic apparatus of claim 1, wherein the first drive unit includes a direct drive motor having a rotor coaxially disposed about the first axis.

3. The robotic apparatus of claim 1,
wherein the workpiece is a semiconductor wafer, and
wherein the second arm member includes an end effector configured to secure the semiconductor wafer.

4. The robotic apparatus of claim 3, wherein the end effector includes at least one of the edge-gripping device and the suction device.

5. A robotic apparatus comprising:
a first arm member configured to pivot about a first axis;
a second arm member pivotably connected to the first arm member, the second arm member having a surface upon which a workpiece can be received;
a first drive unit configured to drive the first arm member to pivot about the first axis; and
a control unit configured to control the first drive unit to move the surface of the second arm member to transport the workpiece, the control unit being configured to control the first drive unit such that the surface is not moved at an acceleration value that exceeds a predetermined acceleration limit during the transport of the workpiece,
wherein the control unit is configured to control the first drive unit to transport the workpiece based on a point-to-point profile of a motion in which acceleration of the surface is restricted to the predetermined acceleration limit or less along an entirety of the point-to-point profile.

6. The robotic apparatus of claim 5, wherein the control unit is configured to control the first drive unit to cause the second arm to exceed the predetermined acceleration limit when the workpiece is not present on the surface of the second arm.

7. The robotic apparatus of claim 1, further comprising a sensor disposed external relative to the first arm unit and second arm unit that provides position feedback to the control unit,
wherein the control unit controls the first drive unit based on the position feedback.

8. The robotic apparatus of claim 1, wherein the control unit is configured to control the first drive unit according to a feed forward control method.

9. The robotic apparatus of claim 1, wherein the control unit is configured to set the predetermined acceleration limit based on a value input from a user.

10. The robotic apparatus of claim 1, further comprising:
a third arm member, the first arm member being pivotably connected to the third arm member about the first axis;
a fourth arm member, the third arm member being pivotably connected to the fourth arm member about a third axis;
a base, the fourth arm member being pivotably connected to the base about a fourth axis;
a second drive unit configured to drive the second arm member to pivot with respect to the first arm member about a second axis;
a third drive unit configured to drive the third arm member to pivot with respect to the fourth arm member about the third axis; and
a fourth drive unit configured to drive the fourth arm member to pivot with respect to the base about the fourth axis.

11. The robotic apparatus of claim 1, further comprising:
an additional arm member having a second surface upon which a second workpiece can be received, the first surface and the second surface being independent from each other; and
an additional drive unit configured to drive the additional arm member to pivot about an additional axis,
wherein the control unit is further configured to control the additional drive unit to move the second surface to transport the second workpiece, the control unit being further configured to control the additional drive unit such that the second surface is not moved at an acceleration value that exceeds the predetermined acceleration limit during the transport of the second workpiece.

12. A robotic apparatus for transporting a semiconductor wafer comprising:
a first arm member configured to pivot about a first axis;

a second arm member pivotably connected to the first arm member, the second arm member having a surface upon which the semiconductor wafer can be received;
a first drive unit configured to drive the first arm member to pivot about the first axis, the first drive unit including a direct drive motor having a rotor coaxially disposed about the first axis; and
a control unit configured to control the first drive unit to move the surface of the second arm member to transport the semiconductor wafer,
wherein the control unit is configured to control the first drive unit without exceeding a predetermined acceleration limit at the surface to retain the semiconductor wafer solely with surface friction between the surface and the semiconductor wafer such that transport of the semiconductor wafer while on the surface of the second arm is performed without use of a suction device and without use of an edge gripping device.

13. The robotic apparatus of claim 12, further comprising:
a third arm member, the first arm member being pivotably connected to the third arm member about the first axis;
a fourth arm member, the third arm member being pivotably connected to the fourth arm member about a third axis;
a base, the fourth arm member being pivotably connected to the base about a fourth axis;
a second drive unit configured to drive the second arm member to pivot with respect to the first arm member about a second axis, the second drive unit including a direct drive motor coaxially disposed about the second axis;
a third drive unit configured to drive the third arm member to pivot with respect to the fourth arm member about the third axis, the third drive unit including a direct drive motor coaxially disposed about the third axis; and
a fourth drive unit configured to drive the fourth arm member to pivot with respect to the base about the fourth axis, the fourth drive unit including a direct drive motor coaxially disposed about the fourth axis.

14. The robotic apparatus of claim 12,
wherein the second arm member includes an end effector configured to secure the workpiece, and
wherein the end effector includes at least one of the edge-gripping device and the suction device.

15. The robotic apparatus of claim 12, further comprising a sensor disposed external relative to the first arm unit that provides position feedback to the control unit,
wherein the control unit controls the first drive unit based on the position feedback.

16. A method of transporting a workpiece with a robotic apparatus, comprising:
providing a robotic apparatus having:
a first arm member configured to pivot about a first axis;
a second arm member pivotably connected to the first arm member, the second arm member having a surface upon which a workpiece can be received;
a first drive unit configured to drive the first arm member to pivot about the first axis; and
a control unit configured to control the first drive unit to move the surface of the second arm member to transport the workpiece;
determining a motion profile to transport the workpiece applied when transporting the workpiece; and
controlling the first drive unit to transport the workpiece according to the motion profile without moving the surface at an acceleration value that exceeds a predetermined acceleration limit,
wherein controlling the first drive unit without exceeding the predetermined acceleration limit includes supporting the workpiece solely with surface friction between the surface and the workpiece such that transport of the workpiece while on the surface of the second arm is performed without the use of suction and without edge gripping.

17. The method according to claim 16, wherein the first drive unit includes a direct drive motor having a rotor coaxially disposed about the first axis.

18. The method according to claim 16, wherein controlling the first drive unit includes transporting the workpiece based on a point-to-point profile of a motion in which acceleration of the surface is restricted to the predetermined acceleration limit or less along an entirety of the point-to-point profile.

19. The robotic apparatus of claim 5,
wherein the second arm member includes an end effector configured to secure the workpiece, and
wherein the end effector includes at least one of an edge-gripping device and a suction device.

* * * * *